(12) United States Patent
Zeng et al.

(10) Patent No.: US 8,304,329 B2
(45) Date of Patent: Nov. 6, 2012

(54) POWER DEVICE STRUCTURES AND METHODS

(75) Inventors: Jun Zeng, Torrance, CA (US); Mohamed N. Darwish, Campbell, CA (US)

(73) Assignee: MaxPower Semiconductor, Inc., Santa Clara, CA (US)

( * ) Notice: Subject to any disclaimer, the term of this patent is extended or adjusted under 35 U.S.C. 154(b) by 136 days.

(21) Appl. No.: 12/626,523

(22) Filed: Nov. 25, 2009

(65) Prior Publication Data
US 2010/0219468 A1 Sep. 2, 2010

Related U.S. Application Data

(60) Provisional application No. 61/118,664, filed on Dec. 1, 2008, provisional application No. 61/122,794, filed on Dec. 16, 2008.

(51) Int. Cl.
*H01L 29/78* (2006.01)
(52) U.S. Cl. ........ 438/506; 438/514; 257/340; 257/409; 257/328
(58) Field of Classification Search .................. 438/506, 438/514; 257/340, 409, 328
See application file for complete search history.

(56) References Cited

U.S. PATENT DOCUMENTS

| | | | |
|---|---|---|---|
| 5,282,018 A | 1/1994 | Hiraki et al. | |
| 5,637,898 A | 6/1997 | Baliga | |
| 5,811,347 A * | 9/1998 | Gardner et al. | 438/435 |
| 5,864,159 A | 1/1999 | Takahashi | |
| 5,973,359 A | 10/1999 | Kobayashi | |
| 5,998,833 A | 12/1999 | Baliga | |
| 6,040,600 A | 3/2000 | Uenishi et al. | |
| 6,069,372 A | 5/2000 | Uenishi | |
| 6,114,727 A | 9/2000 | Ogura et al. | |
| 6,191,447 B1 | 2/2001 | Baliga | |
| 6,251,730 B1 | 6/2001 | Luo | |
| 6,388,286 B1 | 5/2002 | Baliga | |
| 6,509,233 B2 * | 1/2003 | Chang et al. | 438/270 |

(Continued)

FOREIGN PATENT DOCUMENTS

EP 0325161 A2 7/1989
(Continued)

OTHER PUBLICATIONS

Bruce Jeffrey Fishbein, Behavior of Ion-Implanted Cesium in Silicon Dioxide Films, Aug. 1988.
(Continued)

*Primary Examiner* — Eugene Lee
(74) *Attorney, Agent, or Firm* — Robert O. Groover, III

(57) ABSTRACT

Vertical power devices which include an insulated trench containing insulating material and a gate electrode, and related methods. A body region is positioned so that a voltage bias on the gate electrode will cause an inversion layer in the body region. A layer of permanent charge, at or near the sidewall of the trench, provides charge balancing for the space charge in the depleted semiconductor material during the OFF state. A conductive shield layer is positioned below the gate electrode in the insulating material, and reduces capacitive coupling between the gate and the lower part of the trench. This reduces switching losses. In other embodiments, a planar gate electrode controls horizontal carrier injection into the vertical conduction pathway along the trench, while a shield plate lies over the trench itself to reduce capacitive coupling.

7 Claims, 33 Drawing Sheets

U.S. PATENT DOCUMENTS

| | | | |
|---|---|---|---|
| 6,525,373 B1 | 2/2003 | Kim | |
| 6,541,820 B1 | 4/2003 | Bol | |
| 6,649,975 B2 | 11/2003 | Baliga | |
| 6,686,244 B2 | 2/2004 | Blanchard | |
| 6,710,403 B2 | 3/2004 | Sapp | |
| 6,803,627 B2 | 10/2004 | Pfirsch | |
| 7,005,353 B2* | 2/2006 | Kocon et al. | 438/270 |
| 7,232,726 B2* | 6/2007 | Peake et al. | 438/270 |
| 7,476,589 B2* | 1/2009 | Grebs et al. | 438/270 |
| 7,504,303 B2* | 3/2009 | Yilmaz et al. | 438/259 |
| 7,825,465 B2* | 11/2010 | Pan et al. | 257/332 |
| 7,929,321 B2* | 4/2011 | Hshieh | 363/25 |
| 7,960,783 B2* | 6/2011 | Darwish et al. | 257/330 |
| 2001/0041407 A1 | 11/2001 | Brown | |
| 2003/0203576 A1 | 10/2003 | Kitada et al. | |
| 2004/0104433 A1 | 6/2004 | Ieong | |
| 2004/0150040 A1 | 8/2004 | Nitta et al. | |
| 2005/0116284 A1 | 6/2005 | Chen | |
| 2006/0060916 A1 | 3/2006 | Girdhar et al. | |
| 2006/0228860 A1 | 10/2006 | Shinohara | |
| 2008/0048266 A1 | 2/2008 | Russ | |
| 2008/0166845 A1* | 7/2008 | Darwish | 438/270 |

FOREIGN PATENT DOCUMENTS

| | | |
|---|---|---|
| EP | 1583152 A2 | 10/2005 |
| EP | 1879229 | 1/2008 |

OTHER PUBLICATIONS

Grant, et al, Power MOSFETS Theory and Applications, John Wiley & Sons Ltd., 1989, p. 68-74.

Kazerounian et al., "CODMOS—A Depletion MOSFET Using Fixed Oxide Charge", 41st Annual Device Research Conference, IEEE Electron Devices Society, Jun. 20-22, 1983.

Konig et al., "The Negatively Charged Insulator-Semiconductor Structure: Concepts, Technological Considerations and Applications,". Solid State Electronics, 2000; 44(1): 111-116.

International Search Report and Written Opinion of PCT Application No. PCT/US08/50505, dated Jul. 7, 2008, 17 pages total.

International Search Report and Written Opinion mailed Jul. 2, 2008 for PCT/US08/50532 filed Jan. 8, 2008.

European Search Report of Application No. 08713649.5 dated Apr. 15, 2011.

European Search Report of Application No. 08727446.0 dated Mar. 14, 2011.

J. T. Watt, B. J. Fishbein & J. D. Plummer; Low-Temperature NMOS Technology with Cesium-Implanted Load Devices; IEEE Trans. Electron Devices, vol. 34, # 1, Jan. 1987; p. 28-38.

J.T.Watt,B.J.Fishbein & J.D.Plummer;Characterization of Surface Mobility in MOS Structures Containing Interfacial Cesium Ions;IEEE Trans.Electron Devices,V36,Jan. 1989; p. 96-100.

J.R.Pfiester, J.R.Alvis & C.D.Gunderson; Gain-Enhanced LDD NMOS Device Using Cesium Implantation; IEEE Trans.Electron Devices, V39, #6, Jun. 1992; p. 1469-1476.

* cited by examiner

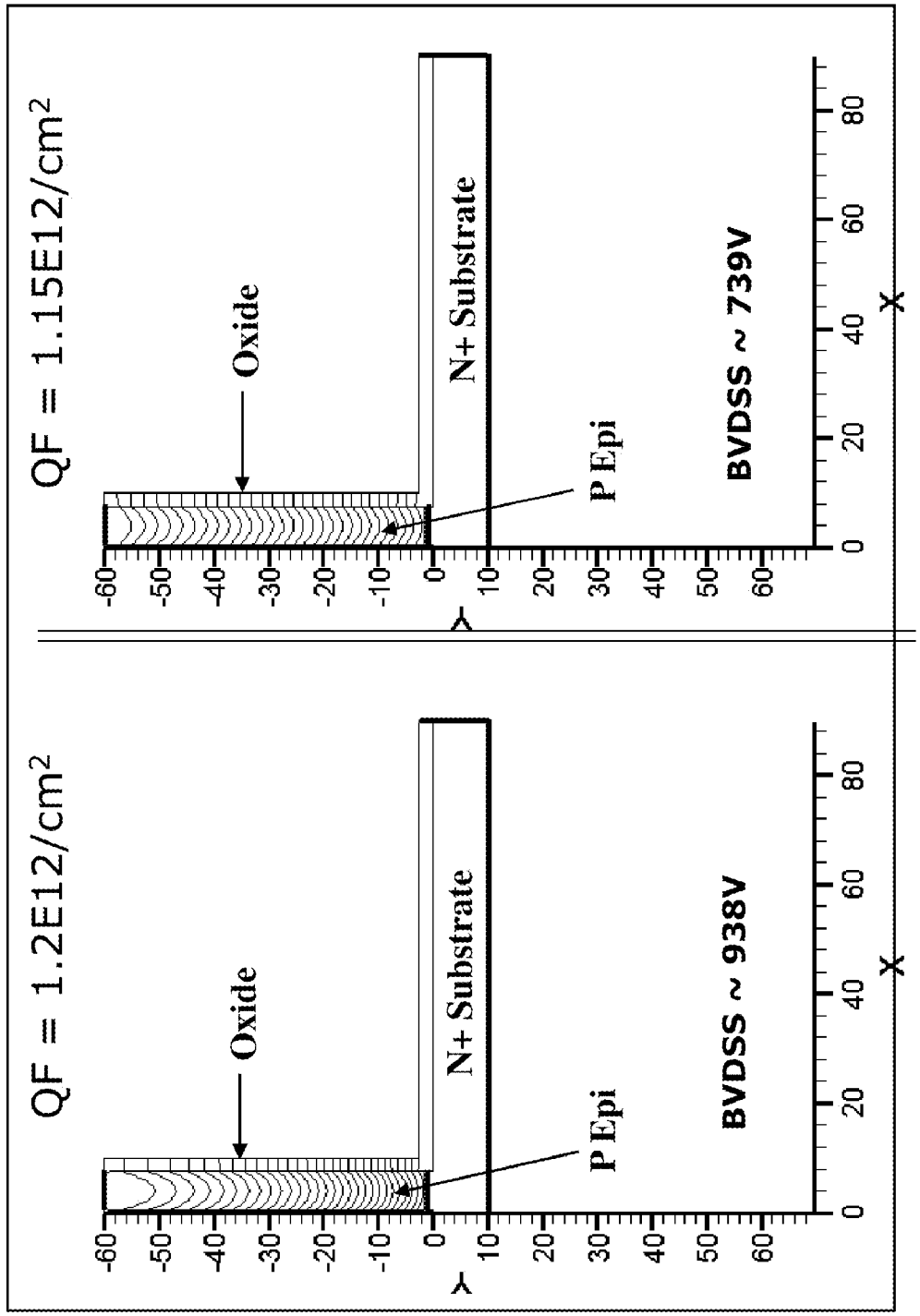

POWER DEVICE STRUCTURES AND METHODS

CROSS-REFERENCE

Priority is claimed from U.S. Application No. 61/118,664, filed Dec. 1, 2008, and also from U.S. Application No. 61/122,794, filed Dec. 16, 2008, both of which are hereby incorporated by reference. The same double priority is also claimed by U.S. application Ser. No. 12/626,589 (MXP-028), which is filed simultaneously herewith, and which is also hereby incorporated by reference.

BACKGROUND

The present application relates to power semiconductor devices, methods, and circuits, and more particularly to power semiconductor devices, methods, and circuits which make use of permanent or immobile electrostatic charge.

Note that the points discussed below may reflect the hindsight gained from the disclosed inventions, and are not necessarily admitted to be prior art.

Power MOSFETs are widely used as switching devices in many electronic applications. In order to minimize the conduction power loss it is desirable that power MOSFETs have a low specific on-resistance ($R_{SP}$ or R*A), which is defined as the product of the on-resistance of the MOSFET multiplied by the active die area. In general, the on-resistance of a power MOSFET is dominated by the channel resistance and the drift region resistances which include the channel resistance, spreading resistance and the epitaxial layer resistance. Recently, the so called superjunction structure has been developed to reduce the drift region resistance. The superjunction is constructed by paralleling highly doped alternating p-type and n-type layers or pillars. The doping concentrations of n-type pillar (the n-type drift region), for the same breakdown voltage, can be significantly higher than that of conventional drift region provided that the total charge of n-type pillar is designed to be balanced with charge in the p-type pillar. In order to fully realize the merit of the superjunction, it is desirable to pack many pillars in a given area to achieve a lower $R_{SP}$. However, the minimum widths, which can be reached in device manufacturing, of the n-type and p-type pillars set a limitation on the cell pitch that can be achieved and the resulting device size.

With reference to FIG. 1, a cross-sectional structural diagram depicts a power MOSFET design as shown in other patent applications which are commonly owned. (See the list of applications given below, which all have at least overlapping ownership, inventorship and copendency with the present application, and all of which are hereby incorporated by reference.) Note that these applications are not necessarily prior art to the present application. This device includes a drain region 102, e.g. a substrate, underlying a p-type drift region 104, which may be provided by an epitaxial layer. A p-body region 106 (contacted by a p+ body contact region 110) separates a source region 108 from the drift region 104. A trench is largely filled with dielectric material 114, but also contains a gate electrode 112. Gate electrode 112 is capacitively coupled to nearby portions of body 106, so that, depending on the applied gate voltage, an inversion layer may be formed at the surface of the body region 106, creating a channel. Frontside source metallization 101 makes ohmic contact to source and body, and backside drain metallization 103 makes ohmic contact to the drain diffusion 102.

Another very important feature is that the device incorporates a sheet of fixed or permanent positive charge ($Q_F$) 116, at or near the sidewalls of the trench, which balances the charge of p-type in the off state. The permanent charge 116 also forms a electron drift region in a power MOSFET by forming an inversion layer along the interface between the dielectric material 114 (e.g. oxide) and P Epi layer 104. By making use of this new concept, the scaling limitation due to inter-diffusion of p-type pillar and n-type pillar can be reduced. Consequently, a small cell pitch and high pillar packing density can be realized to reduce the device total on-resistance and $R_{SP}$.

However, as the cell pitch is reduced the intrinsic capacitances of the device, such as gate-to-source capacitance ($C_{gs}$) and gate-to-drain capacitance ($C_{gd}$), also increase. As a consequence, the switching loss of the device increases. This is undesirable.

The turn-on characteristics of the device in FIG. 1 have been simulated. The key components of device capacitances during the device turn-on process are illustrated by the internal electric field lines shown in FIG. 2. The most significant component which controls the device switching, power losses, is the total charge associated with charging or discharging the gate-drain capacitance $C_{gd}$. This charge is the so-called "Miller charge" $Q_{gd}$. Therefore, it is important to reduce $Q_{gd}$ in order to reduce total losses.

SUMMARY

The present inventors have realized that the Miller charge of a structure like that of FIG. 1 can be reduced in a very simple way. As shown in FIG. 2, coupling from the bottom of the gate electrode to the permanent charge along the lower sidewalls of the trench is an important contributor to the Miller capacitance. The present application teaches that a conductive shield layer should be positioned to reduce this coupling, and thus reduce the gate-to-drain capacitance.

The disclosed innovations, in various embodiments, provide one or more of at least the following advantages. However, not all of these advantages result from every one of the innovations disclosed, and this list of advantages does not limit the various claimed inventions.

Reduced Miller charge;
Reduced gate-drain capacitances;
Improved $R_{sp}$ (specific on-resistance);
Improved device switching speed;
Reduced ratio of $C_{GD}$ to $C_{GS}$ capacitances. (This reduces common-mode conduction.)

BRIEF DESCRIPTION OF THE DRAWINGS

The disclosed inventions will be described with reference to the accompanying drawings, which show important sample embodiments and which are incorporated in the specification hereof by reference, wherein:

FIG. 2 depicts electric field vectors in a device during turn-on;

FIGS. 17(a)-17(b) show blocking characteristics, for the termination structure of FIG. 16, at the onset of breakdown, for two different fixed charge densities.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

Figure 3A:
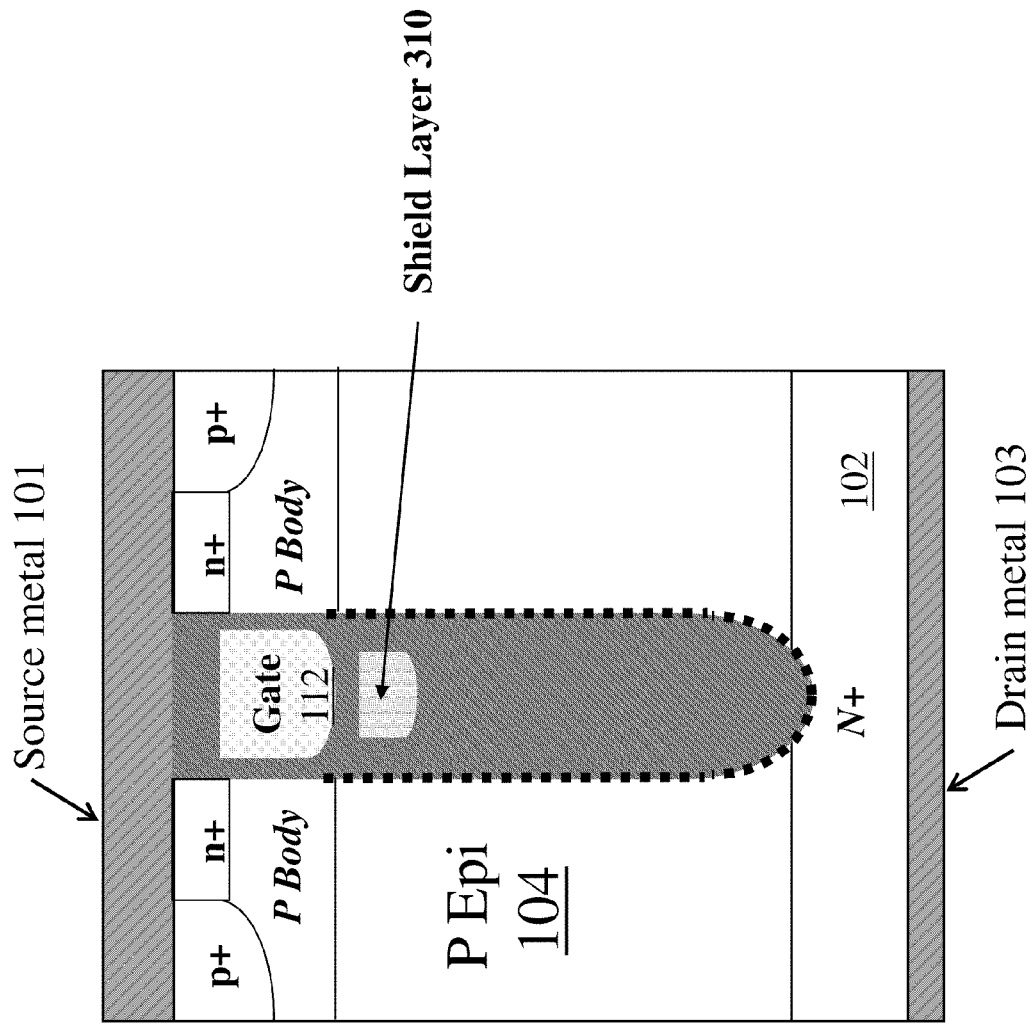
FIG. 3(a) is a cross-sectional structural diagram depicting a power device in accordance with one illustrative class of embodiments.

In this application, several different device structures are disclosed to overcome the switching disadvantage of prior art devices. FIG. 3(a) depicts a device in which an additional embedded conductive layer 310 is introduced underneath the gate layer 112. This conductive shield layer 310 can be shorted to the Source terminal 101 (or alternatively can be biased separately). (Less preferably, this conductive layer can even be left floating.) This layer can be formed from polysilicon or metal. As a result, the Gate terminal 112 is electrically shielded from the drain region 102 and the gate-to-drain charge $Q_{gd}$ is therefore lowered. Note that the on-state behavior of the device is not degraded at all by the addition of shield layer 310.

Figure 3B:
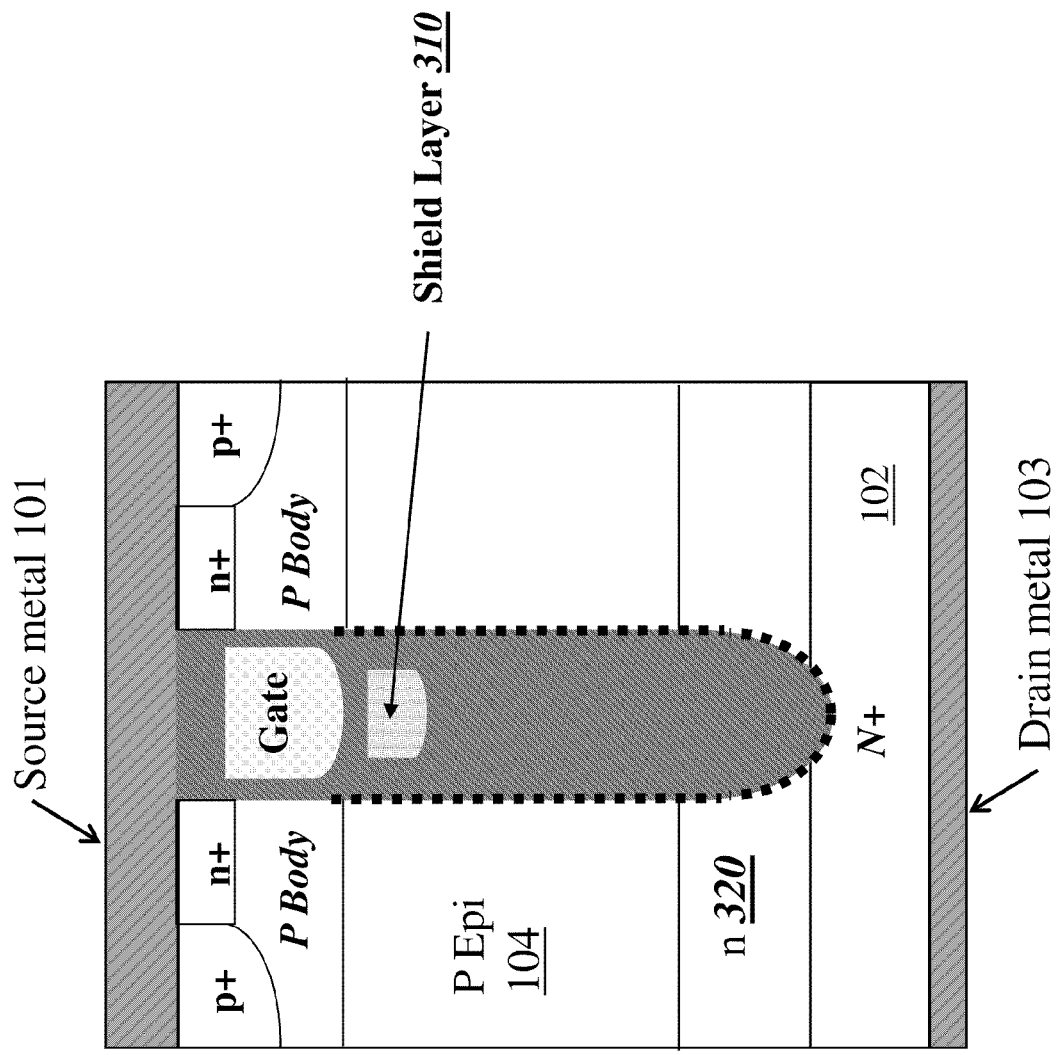
FIG. 3(b) is a cross-sectional structural diagram depicting a power device in accordance with yet another illustrative class of embodiments.

Another implementation is shown in FIG. 3(b), where the device has an n-type thin drain region 320 between p-epi drift layer 104 and the deep drain (N+ substrate) 102.

Figure 4A:
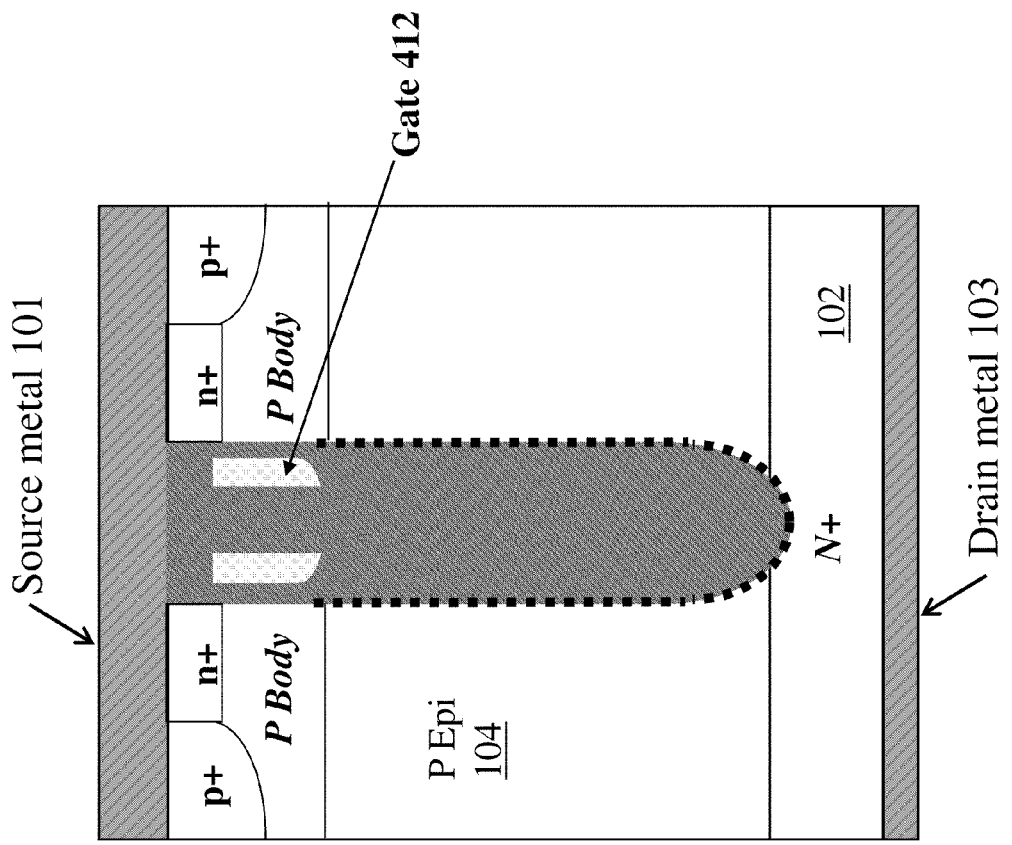
FIG. 4(a) is a cross-sectional structural diagram depicting a power device in accordance with yet another illustrative class of embodiments.
Figure 4B:
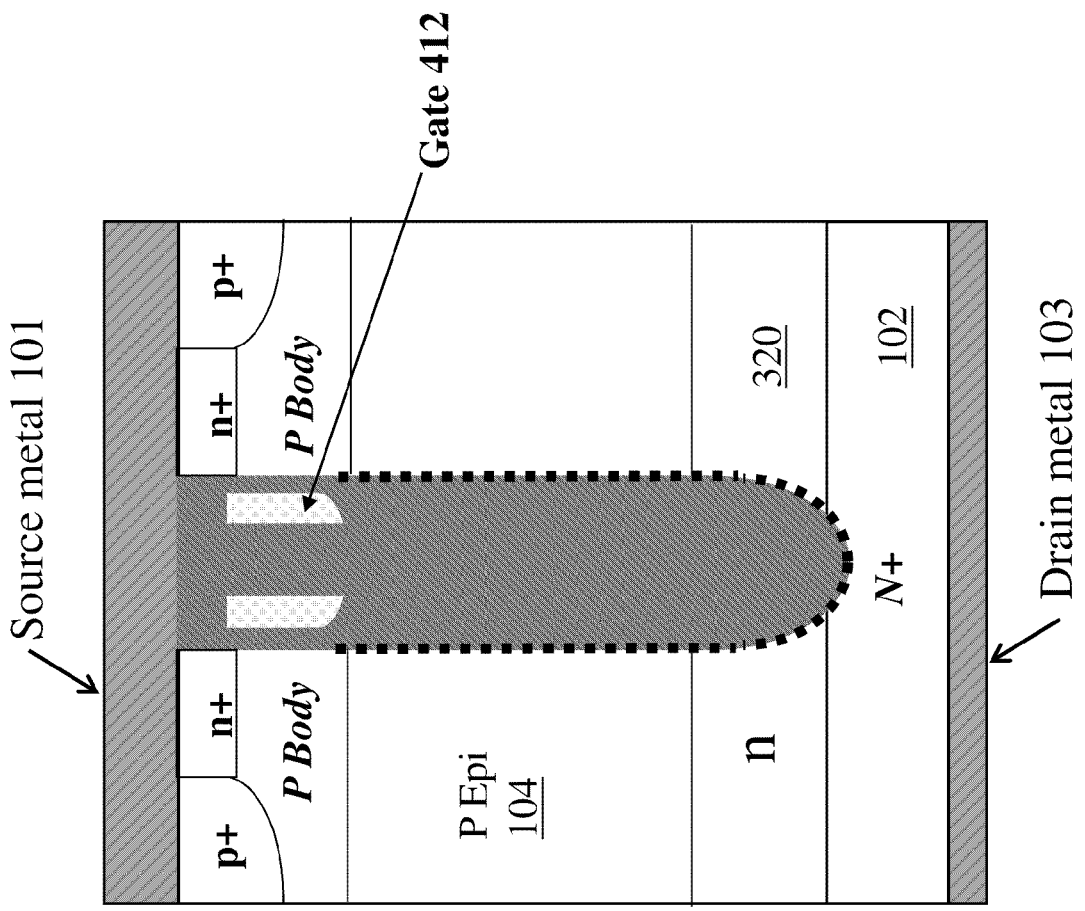
FIG. 4(b) is a cross-sectional structural diagram depicting a power device in accordance with yet another illustrative class of embodiments.

$Q_{gd}$ can also be decreased by minimizing the overlay area of the gate 112 and drain region 102. This may be accomplished, for example, by using a split or pierced gate electrode 412 as illustrated in FIGS. 4(a) and 4(b). Because of the reduced bottom surface area, and the taper of the gate electrode 412 toward the drain 102, the capacitance between the gate electrode 412 and the drain 102 is reduced.

Note that FIG. 4(b), like FIG. 3(b), includes an n-type thin drain region 320 between p-epi drift layer 104 and the deep drain (N+ substrate) 102.

Figure 5A:
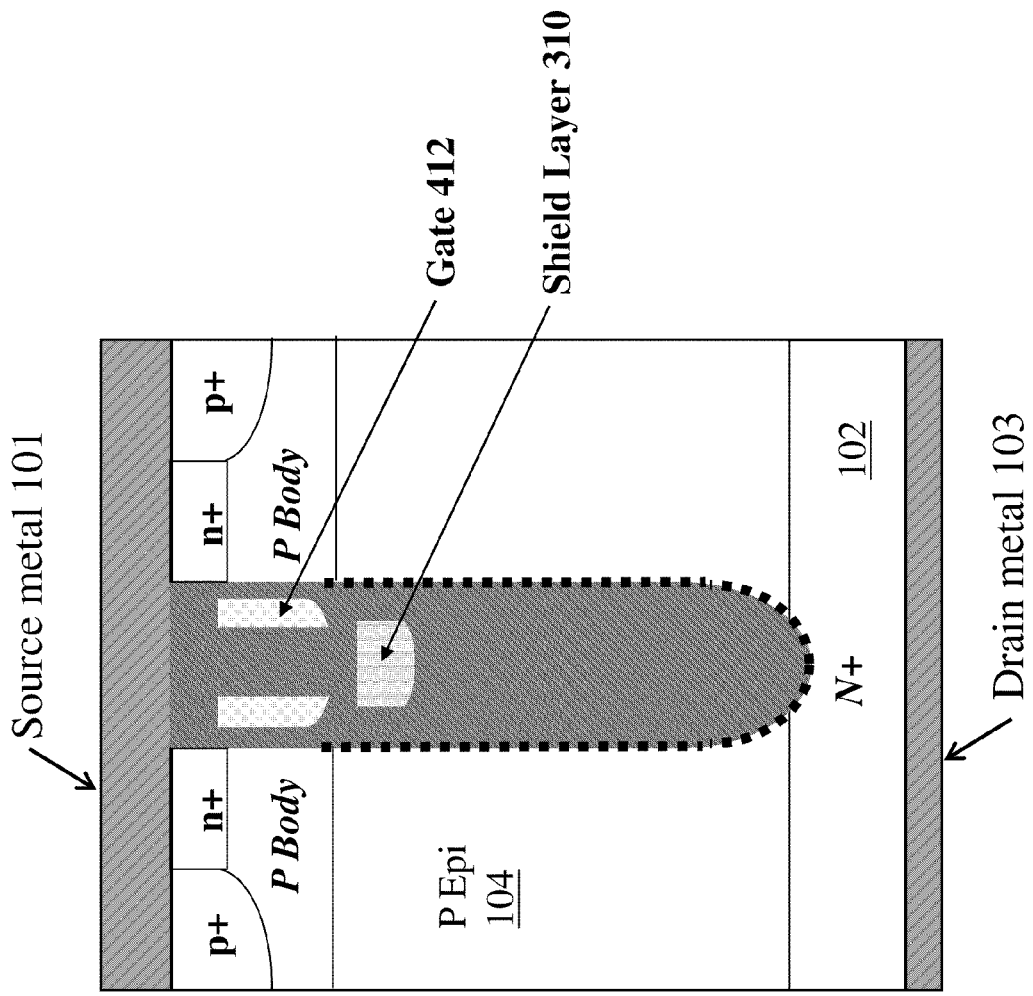
FIG. 5(a) is a cross-sectional structural diagram depicting a power device in accordance with yet another illustrative class of embodiments.
Figure 5B:
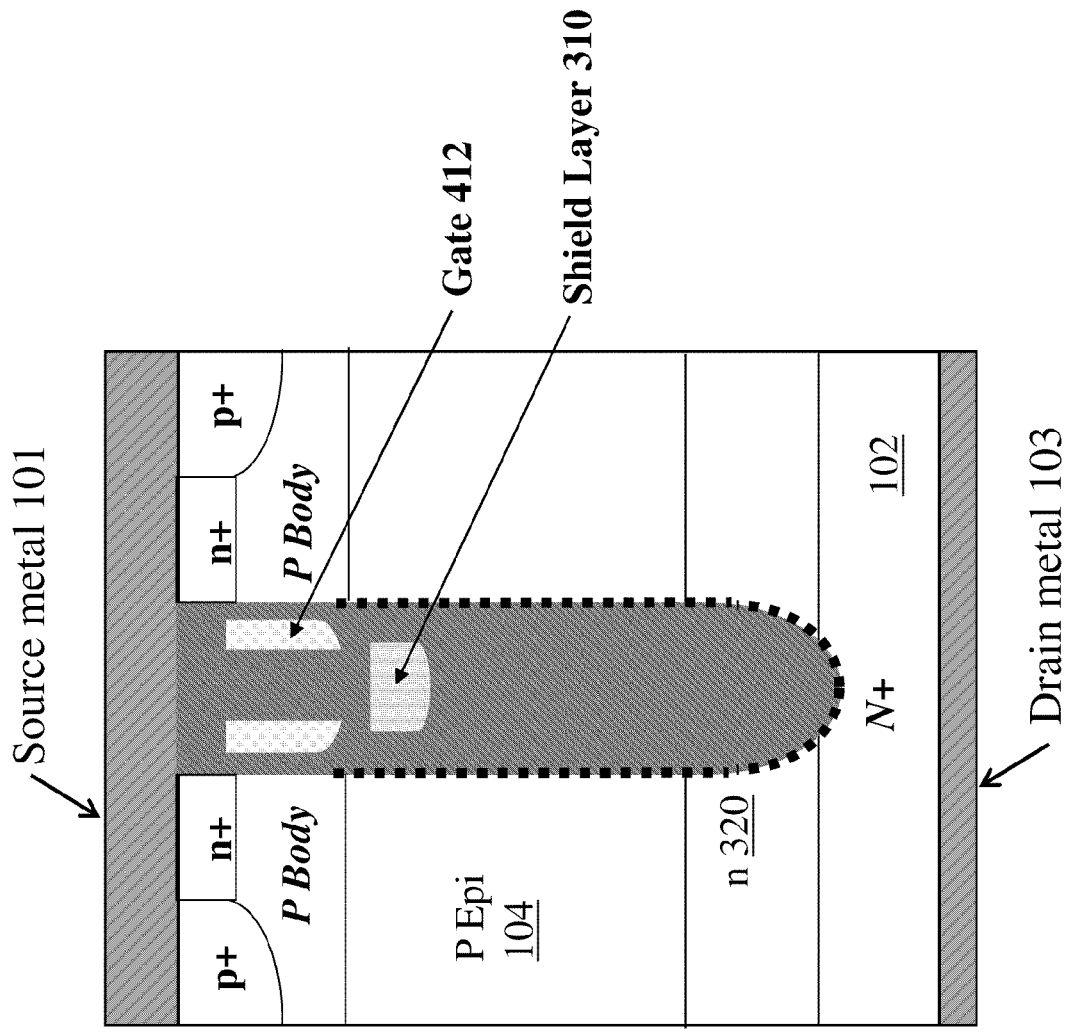
FIG. 5(b) is a cross-sectional structural diagram depicting a power device in accordance with yet another illustrative class of embodiments.

By adding a shield 310 between the split or pierced gate electrodes 412 and the drain 102 in the dielectric material 114, further capacitance reductions can be achieved, as shown in FIGS. 5(a) and 5(b).

Figure 5C:
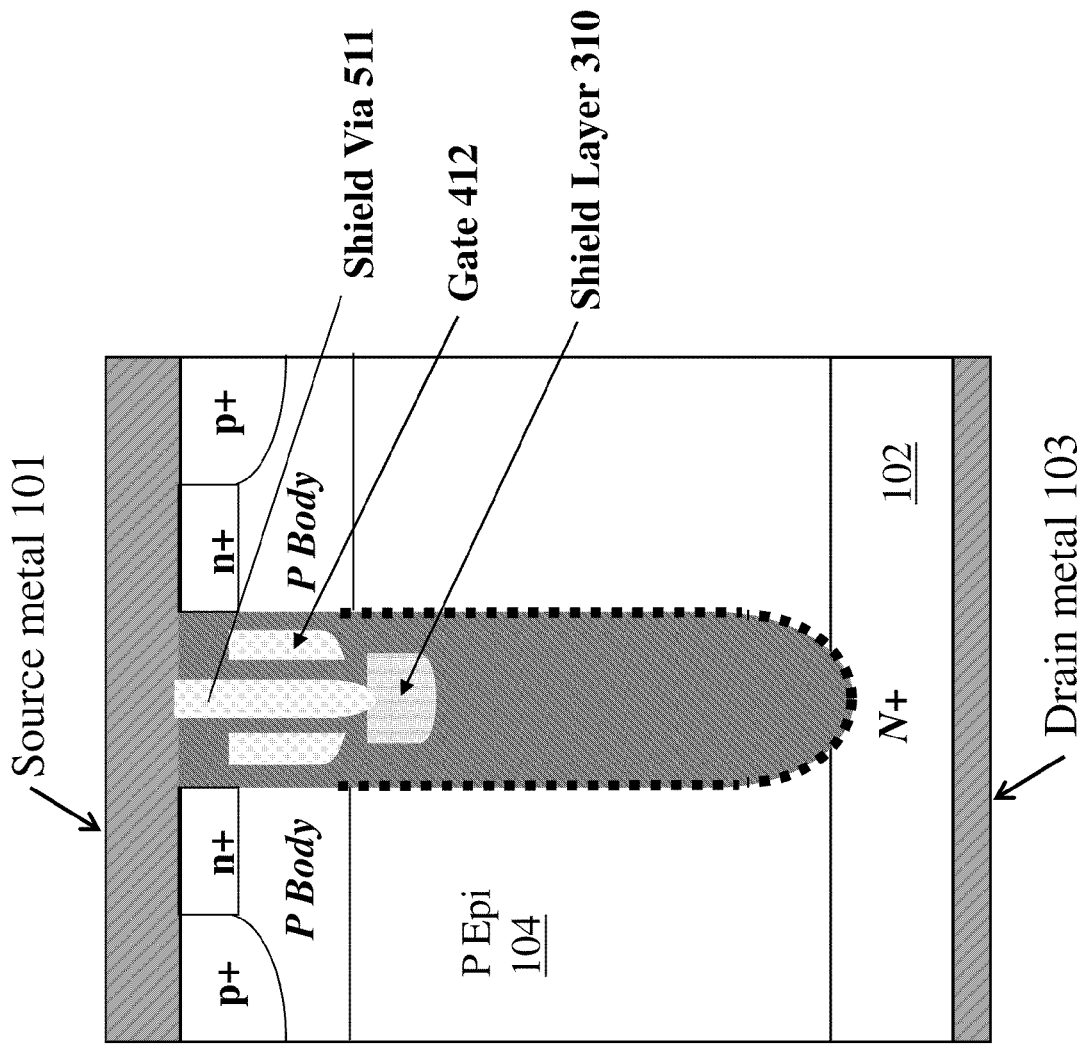
FIG. 5(c) is a cross-sectional structural diagram depicting a power device in accordance with yet another illustrative class of embodiments.
Figure 5D:
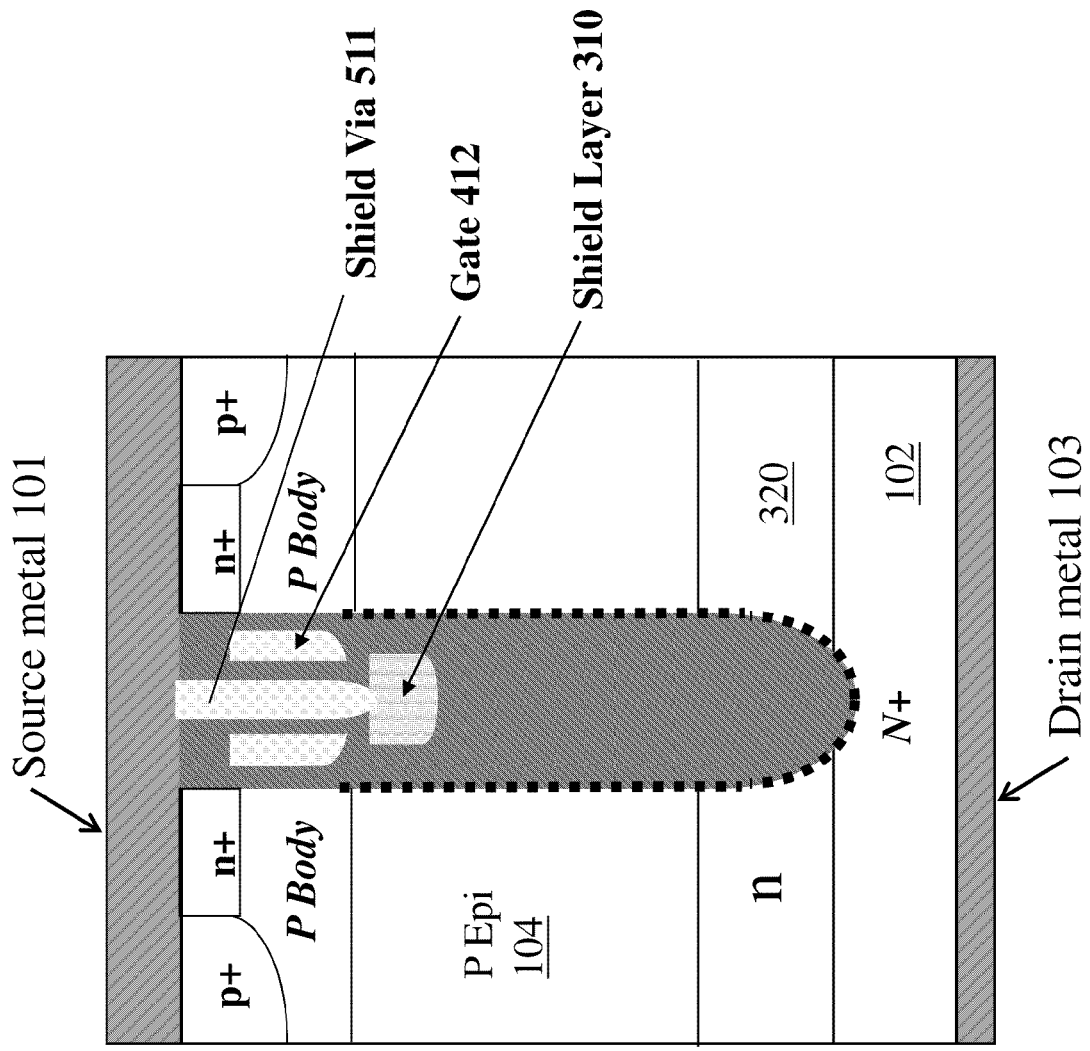
FIG. 5(d) is a cross-sectional structural diagram depicting a power device in accordance with yet another illustrative class of embodiments.

An alternative shield structure 310 is shown in FIGS. 5(c) and 5(d), where a "shield via" 511 is used to make connection to the shield plate 310, through the split or pierced gate electrode 412.

Further reduction in $Q_{gd}$ can be obtained by reducing the fringing capacitance in the transition region from the Gate 612 to the Shield Layer 310. This is realized by using a keystone or T-shaped gate 612, as shown in FIGS. 6(a) and 6(b).

Figure 6A:
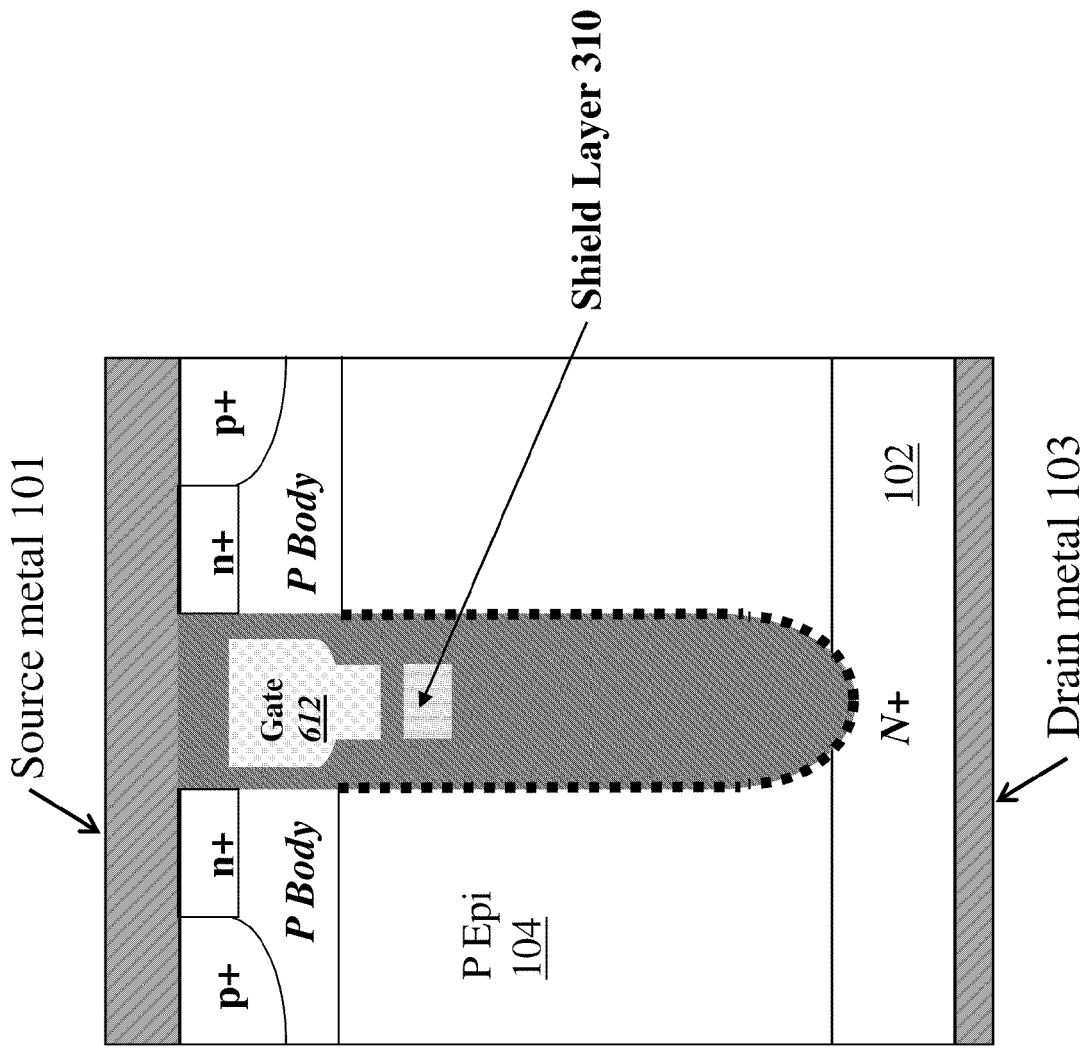
FIG. 6(a) is a cross-sectional structural diagram depicting a power device in accordance with yet another illustrative class of embodiments.
Figure 6B:
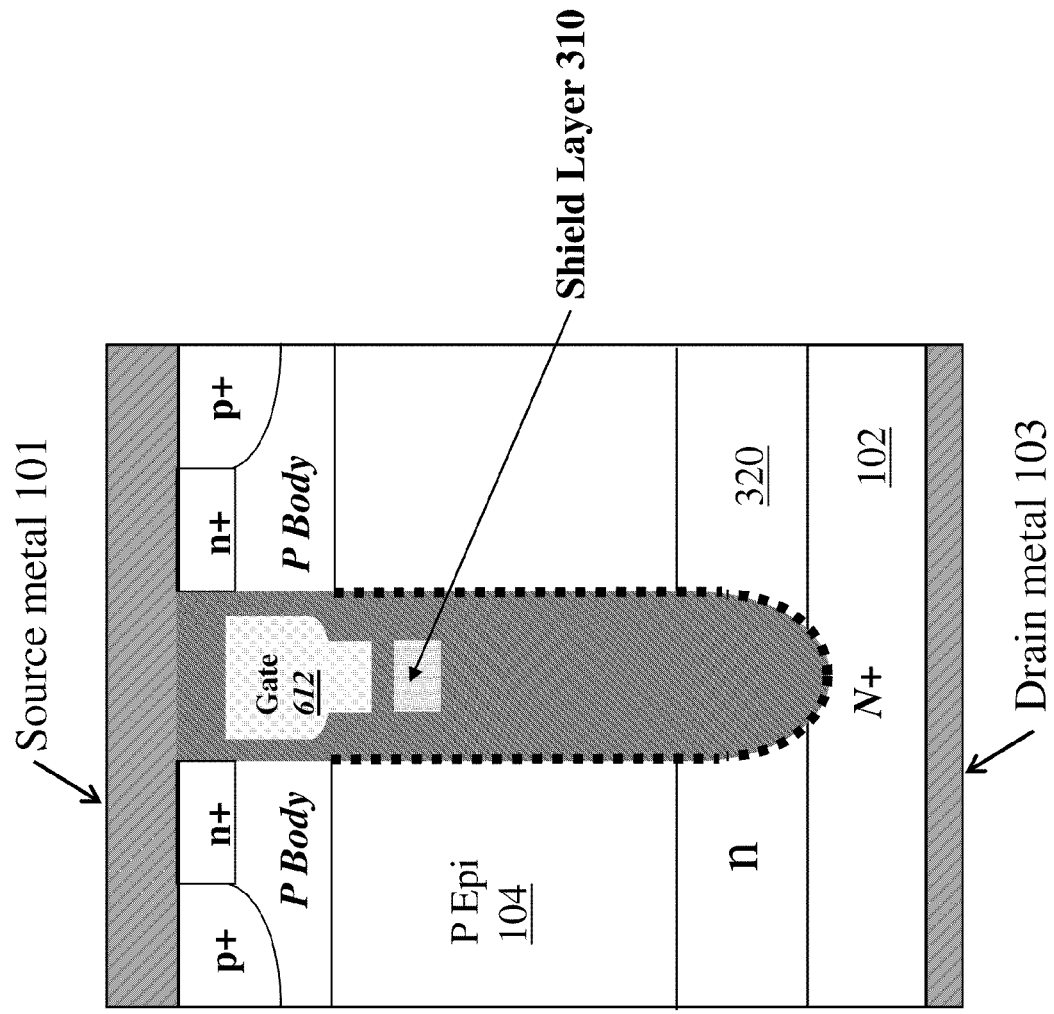
FIG. 6(b) is a cross-sectional structural diagram depicting a power device in accordance with yet another illustrative class of embodiments.

FIG. 6(b) is generally similar to FIG. 6(a), except that a thin drain region 320 has been added.

Figure 1:
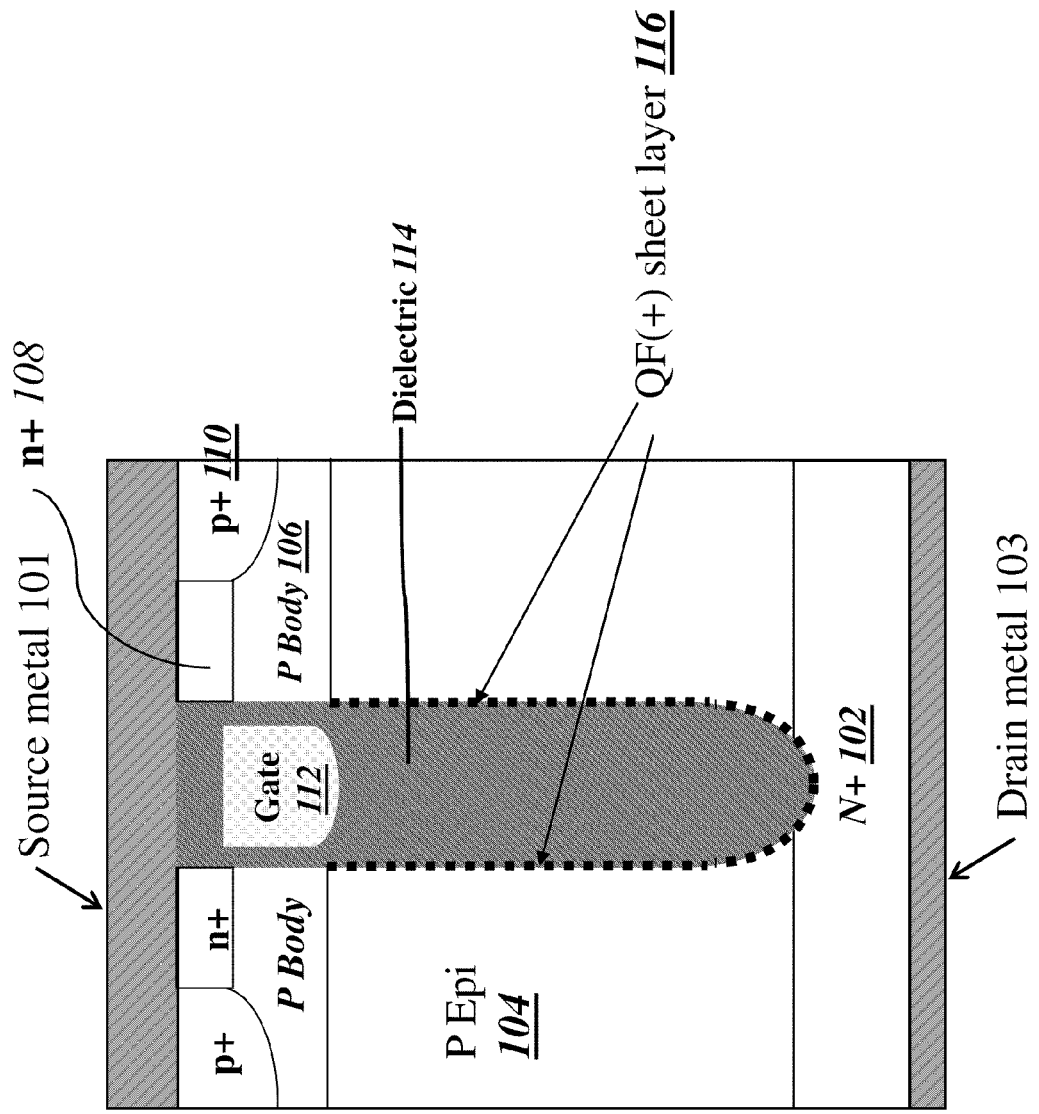
FIG. 1 is a cross-sectional structural diagram depicting a power device according to previous applications of the same assignee.
Figure 2:
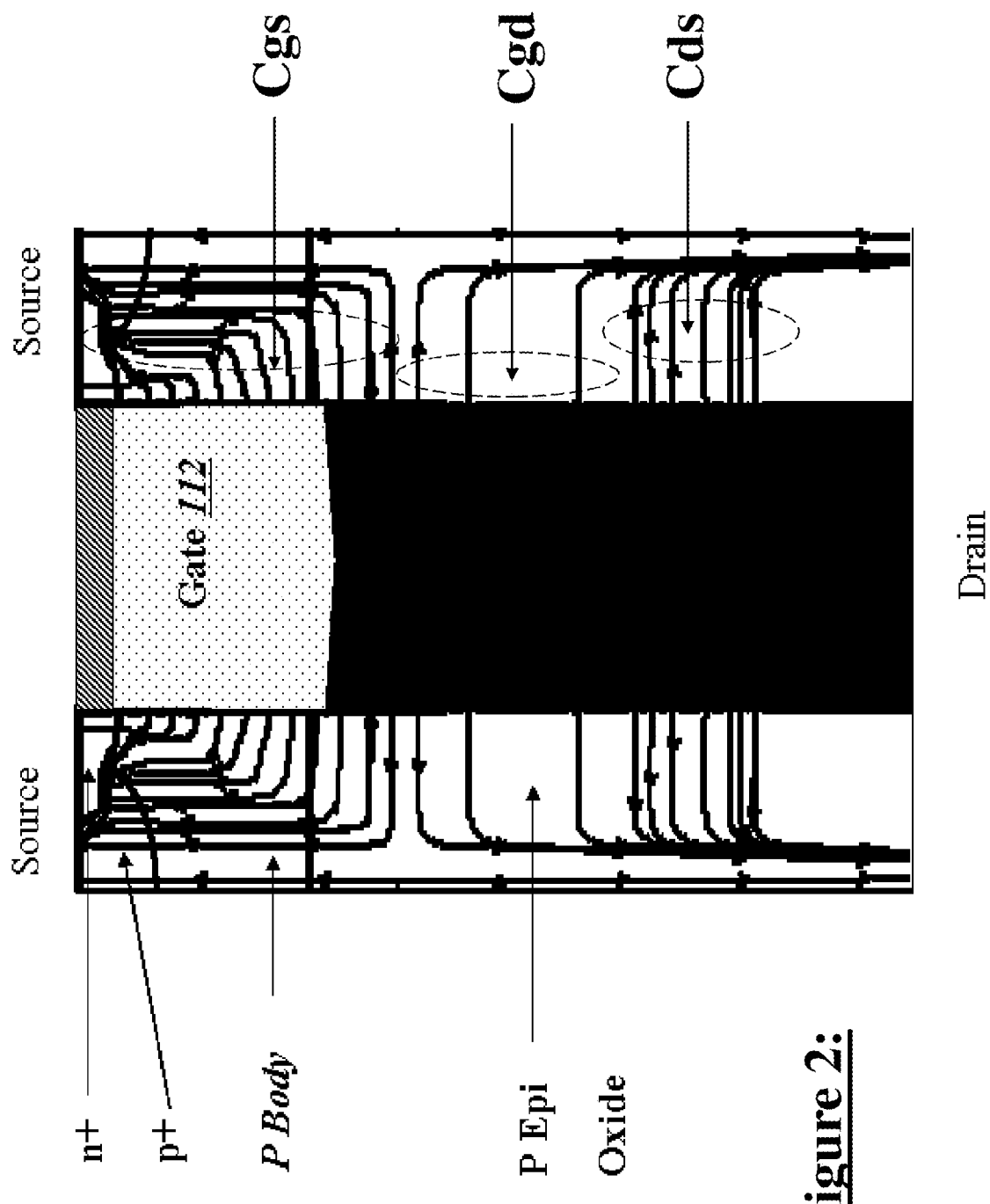
Figure 7:
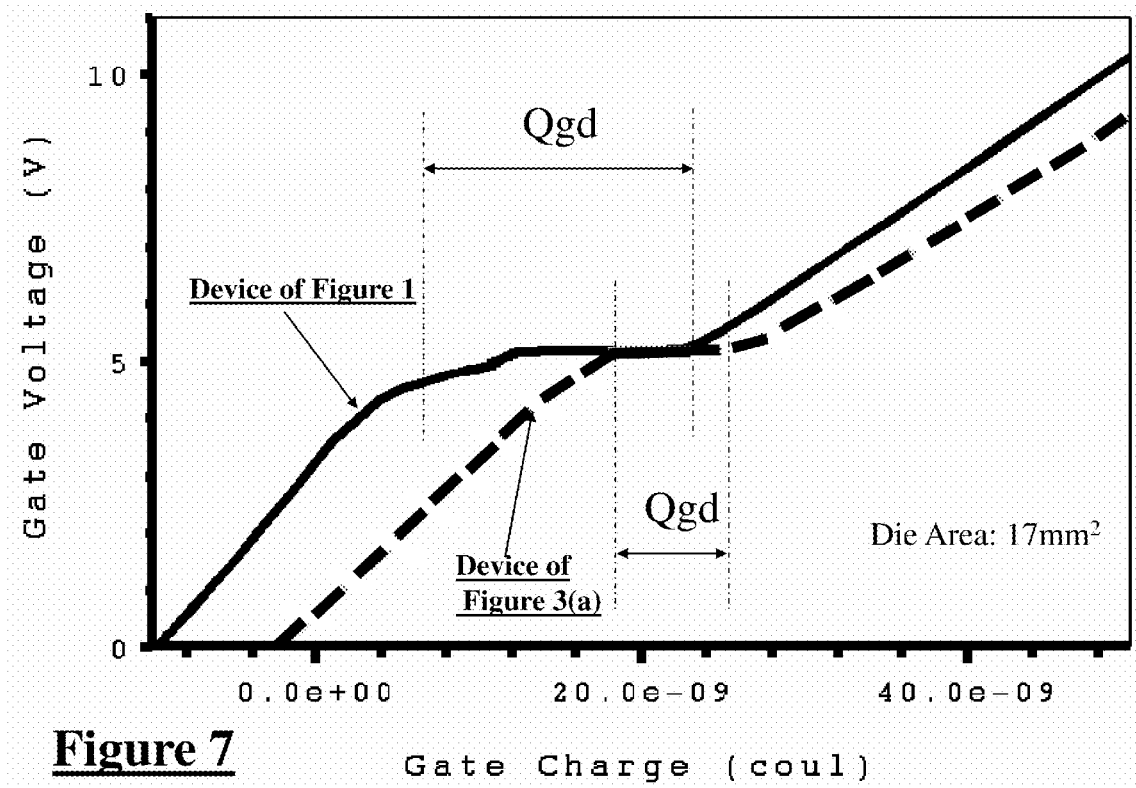
FIG. 7 is a graph plotting gate voltage against gate charge.

In order to verify the concepts in these novel device structures, two dimensional device simulations have been performed to study the switching characteristics of the new device. In this example, the embodiment of FIG. 3(a) was chosen to compare with the earlier structure of FIG. 1. The resulting gate voltage vs. gate charge curve is shown in FIG. 7. It clearly confirms that the structure of FIG. 3(a) has a significantly lower "Miller Charge" $Q_{gd}$ compared to the device shown in FIG. 1.

Figure 8:
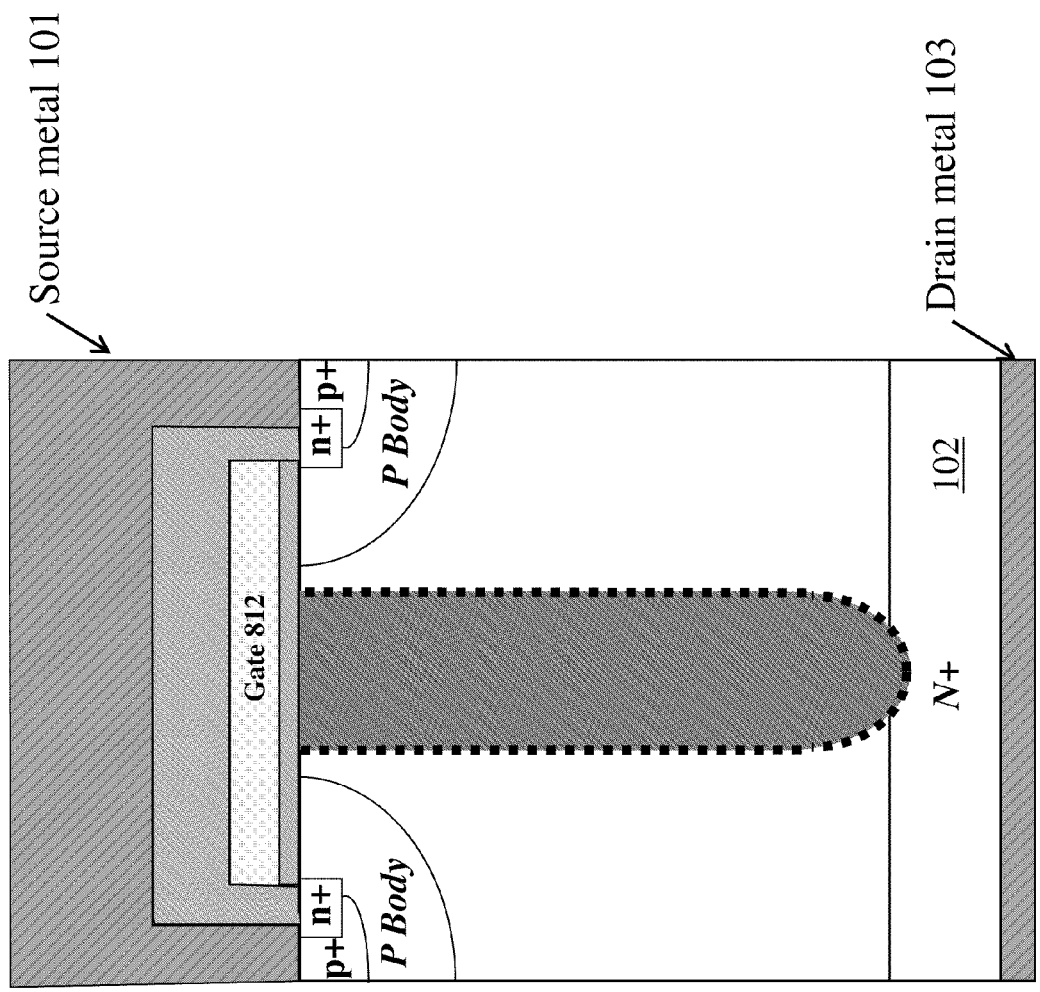
FIG. 8 is a cross-sectional structural diagram depicting a conventional quasi-planar power device.

The previous classes of embodiments show how high-voltage trench devices have been improved. FIG. 8 shows a conventional quasi-planar device using fixed or permanent charge, and improvements to this class of structures will now be described. Note that the planar gate 812 in this example extends right across the trench.

Figure 9A:
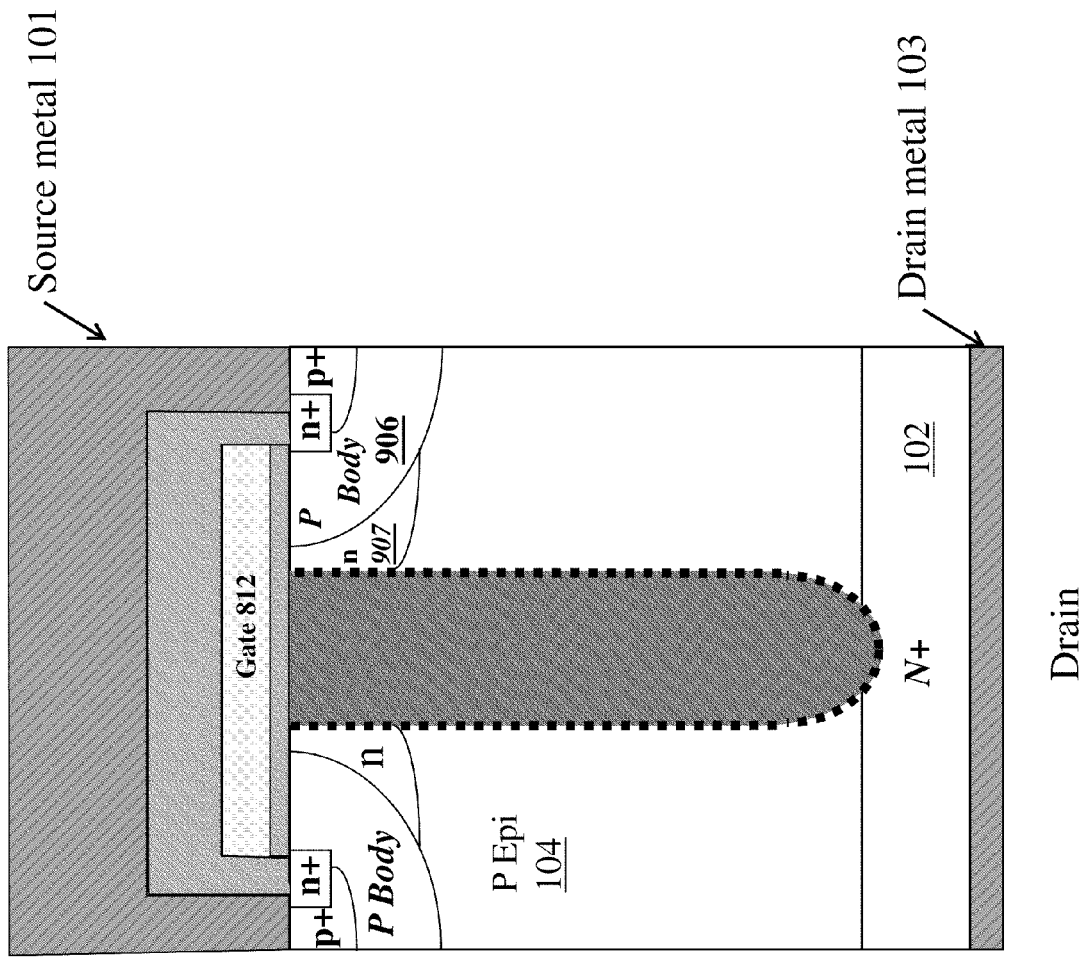
FIG. 9(a) is a cross-sectional structural diagram depicting a power device in accordance with an illustrative class of embodiments.

A first class of improvements is shown in FIG. 9(a), where an additional n-type surface diffusion 907 has been interposed between the p-body 906 and the trench sidewall. This provides good on-state conductivity, while allowing separation between body 906 and the trench.

Figure 9B:
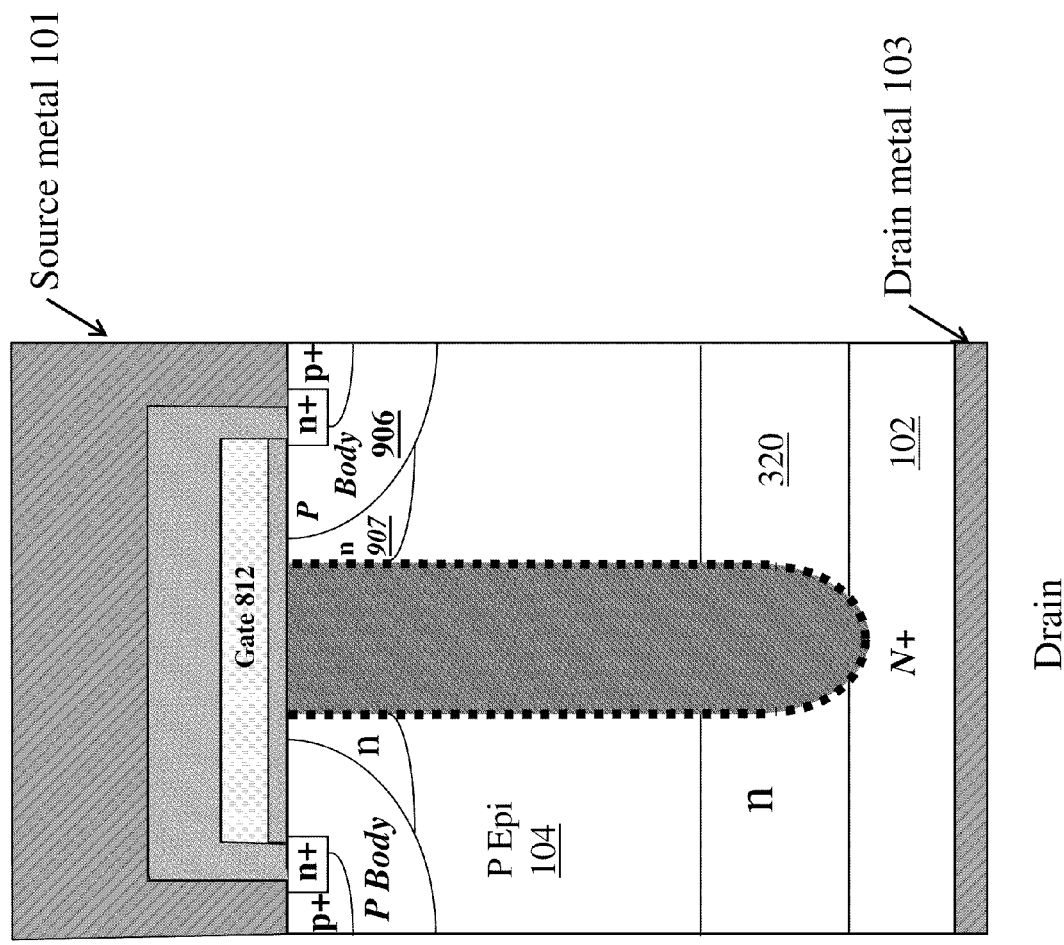
FIG. 9(b) is a cross-sectional structural diagram depicting a power device in accordance with yet another illustrative class of embodiments.

FIG. 9(b) shows a modified device structure which is generally similar to that of FIG. 9(a), but which also includes a thin drain region 320. This embodiment too reduces the specific on-resistance and also the gate-drain coupling, with many resulting advantages.

Figure 9C:
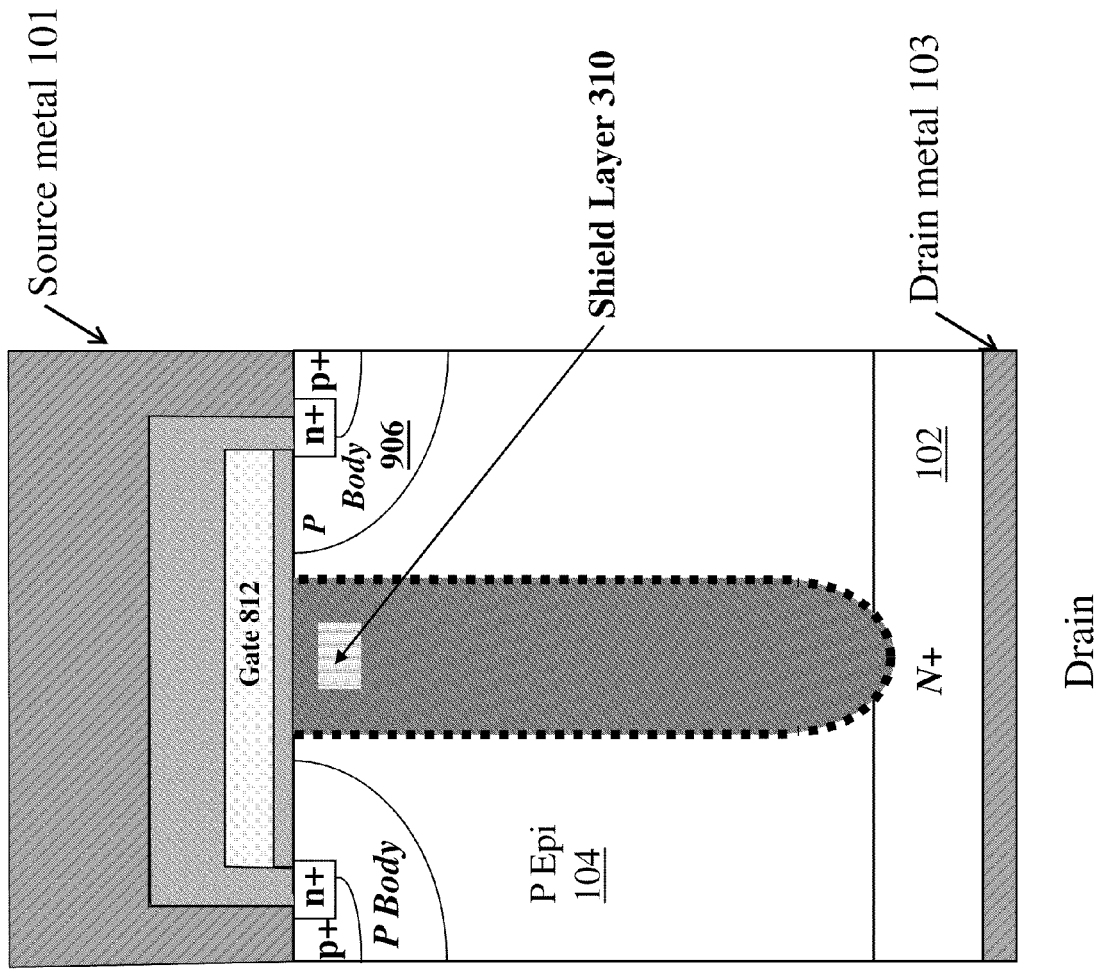
FIG. 9(c) is a cross-sectional structural diagram depicting a power device in accordance with yet another illustrative class of embodiments.

FIG. 9(c) shows an example of a different class of modified device structures. The device structure of FIG. 9(c) still has a planar gate like that of FIG. 8, but also includes a shield structure 310 within the trench dielectric 114. Note that, in this particular embodiment, the planar gate 812 overlies the shield structure 310. As discussed above, the shield structure 310 reduces the specific on-resistance and also the gate-drain coupling, with many resulting advantages.

Figure 9D:
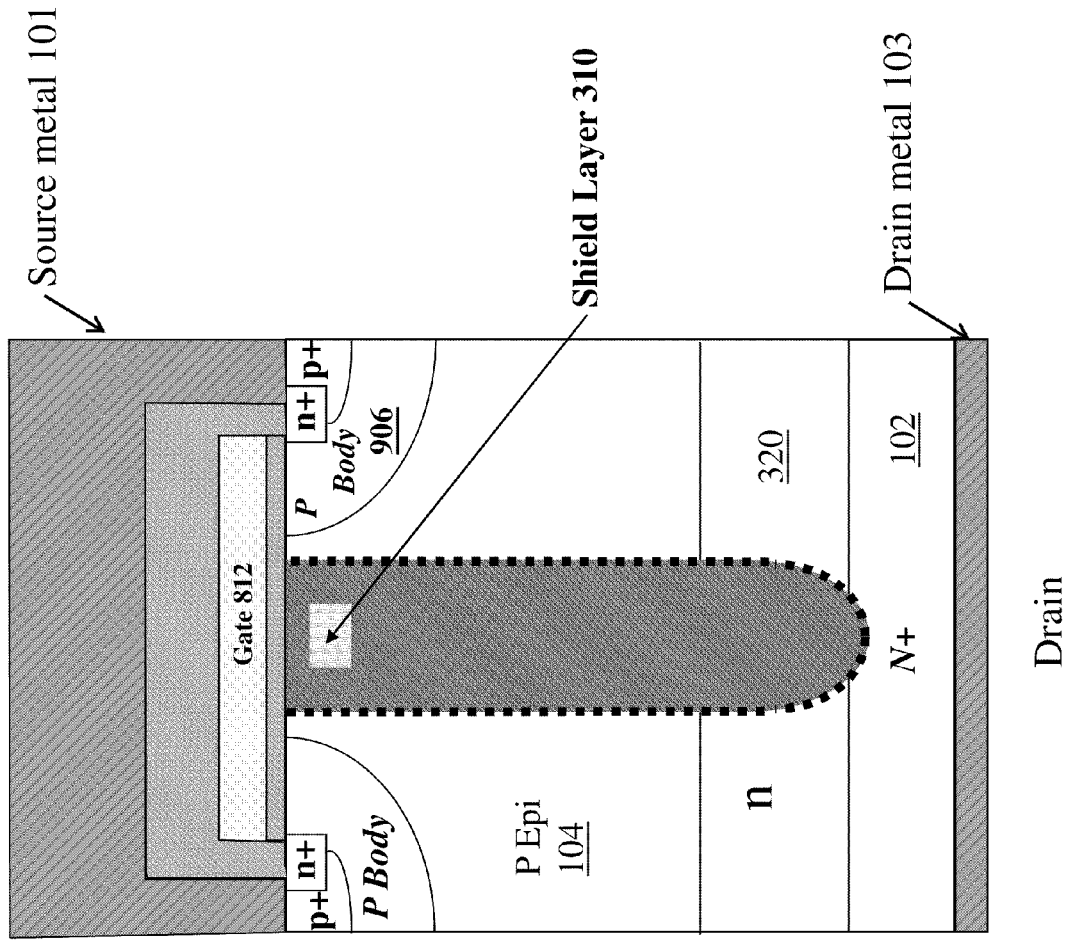
FIG. 9(d) is a cross-sectional structural diagram depicting a power device in accordance with yet another illustrative class of embodiments.

FIG. 9(d) shows a device structure which is generally similar to that of FIG. 9(c), but which also includes a thin drain region 320. Here too the shield structure 310 reduces the specific on-resistance and also the gate-drain coupling, with many resulting advantages.

Figure 10A:
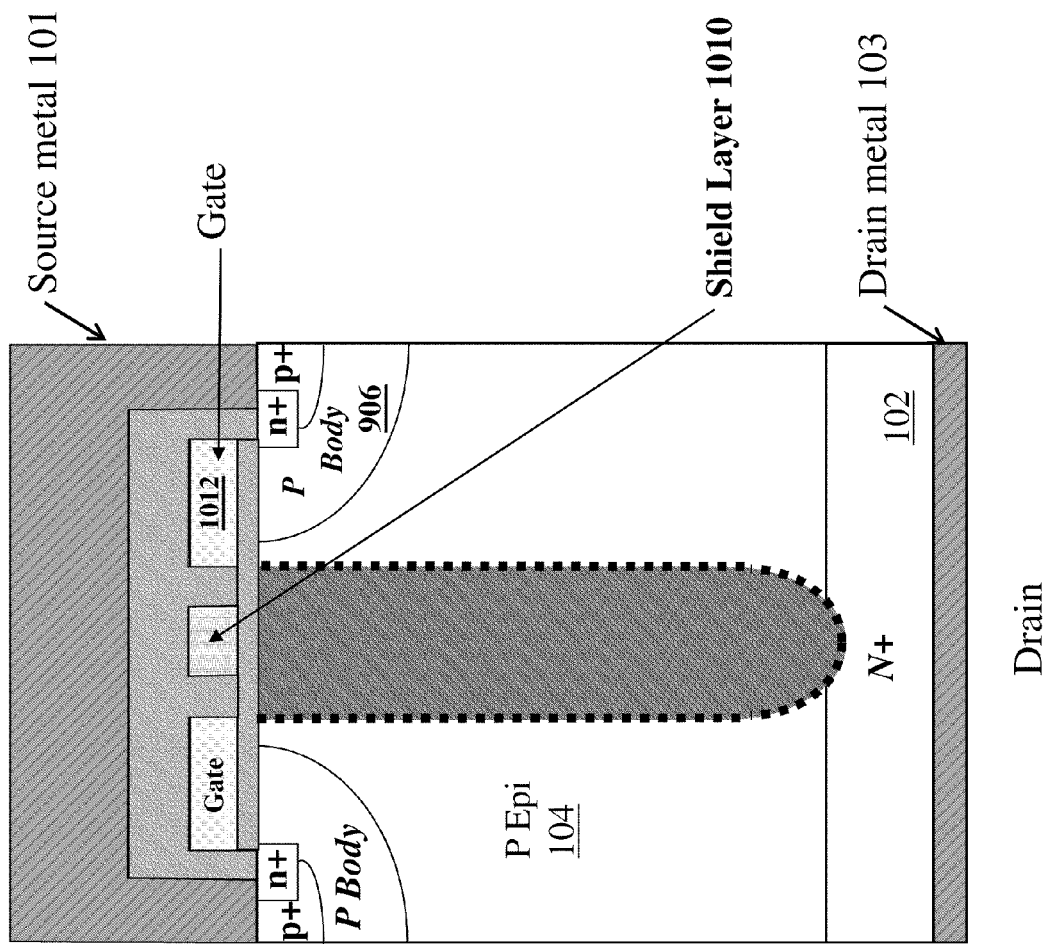
FIG. 10(a) is a cross-sectional structural diagram depicting a power device in accordance with yet another illustrative class of embodiments.

FIG. 10(a) shows an example of another class of embodiments. In these embodiments the planar gate 1012 does not cover the trench, as the planar gate 812 does, but instead has an opening over at least part of the trench. The shape of this opening can be slots or circular holes, and may or may not be self-aligned to the trench. Instead, a shield layer 1010 is situated between, and coplanar with, the illustrated portions of the gate electrode(s) 1012. The shield structure 1010 reduces gate-drain coupling, with many resulting advantages.

Figure 10B:
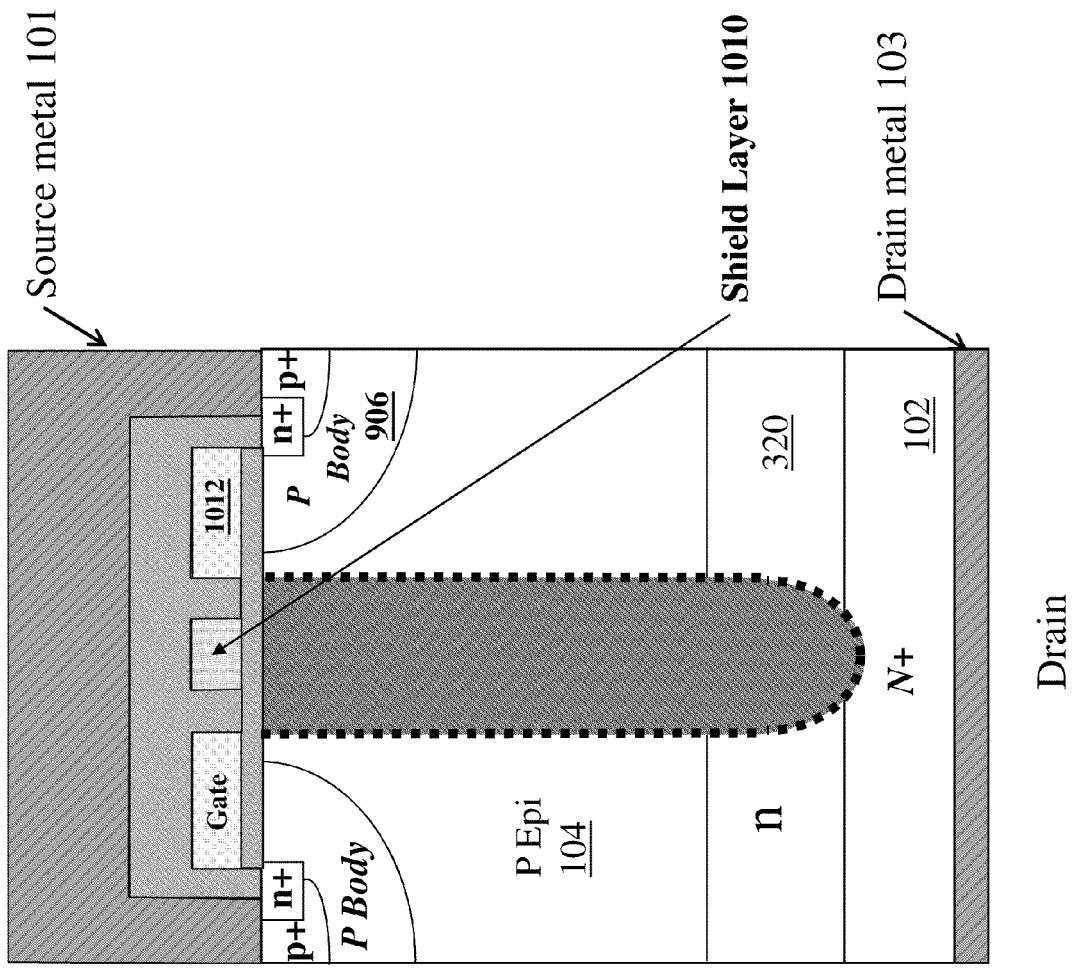
FIG. 10(b) is a cross-sectional structural diagram depicting a power device in accordance with yet another illustrative class of embodiments.

FIG. 10(b) shows a modified device structure which is generally similar to that of FIG. 10(a), but which also includes a thin drain region 320. This embodiment too reduces gate-drain coupling, with many resulting advantages.

Figure 10C:
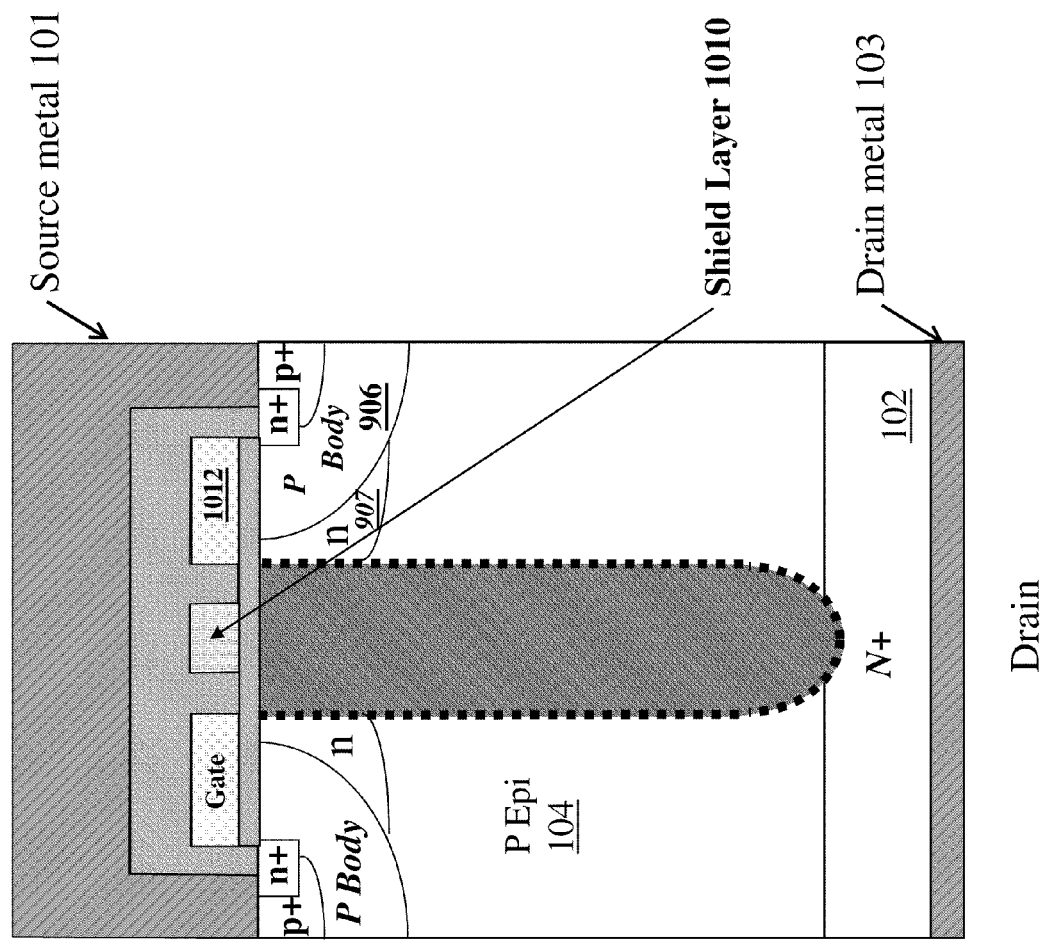
FIG. 10(c) is a cross-sectional structural diagram depicting a power device in accordance with yet another illustrative class of embodiments.

FIG. 10(c) is an example of another class of embodiments. In this example a coplanar shield like that of FIG. 10(a) is combined with an interposed diffusion 907, like that of FIG. 9(a). This combination is believed to further reduce the specific on-resistance and also the gate-drain coupling, with many resulting advantages.

Figure 10D:
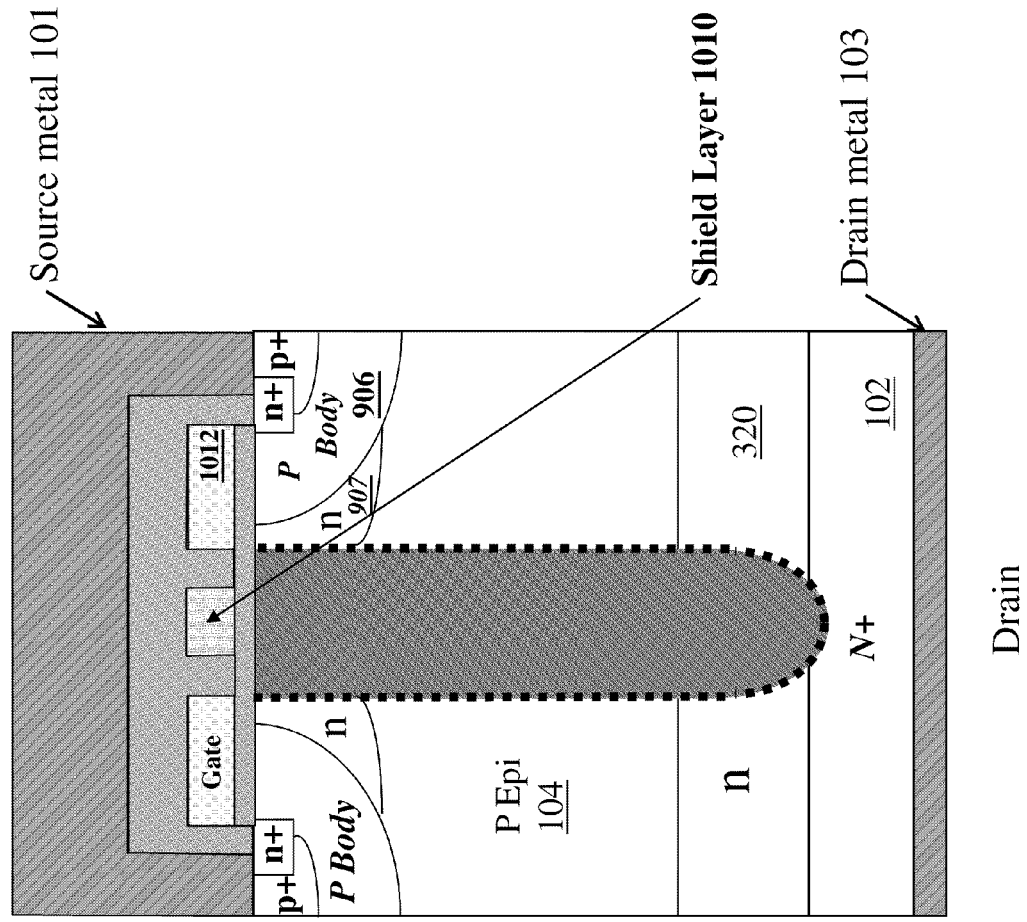
FIG. 10(d) is a cross-sectional structural diagram depicting a power device in accordance with yet another illustrative class of embodiments.

FIG. 10(d) shows a modified device structure which is generally similar to that of FIG. 10(c), but which also includes a thin drain region 320. This embodiment too reduces gate-drain coupling, with many resulting advantages.

Figure 11A:
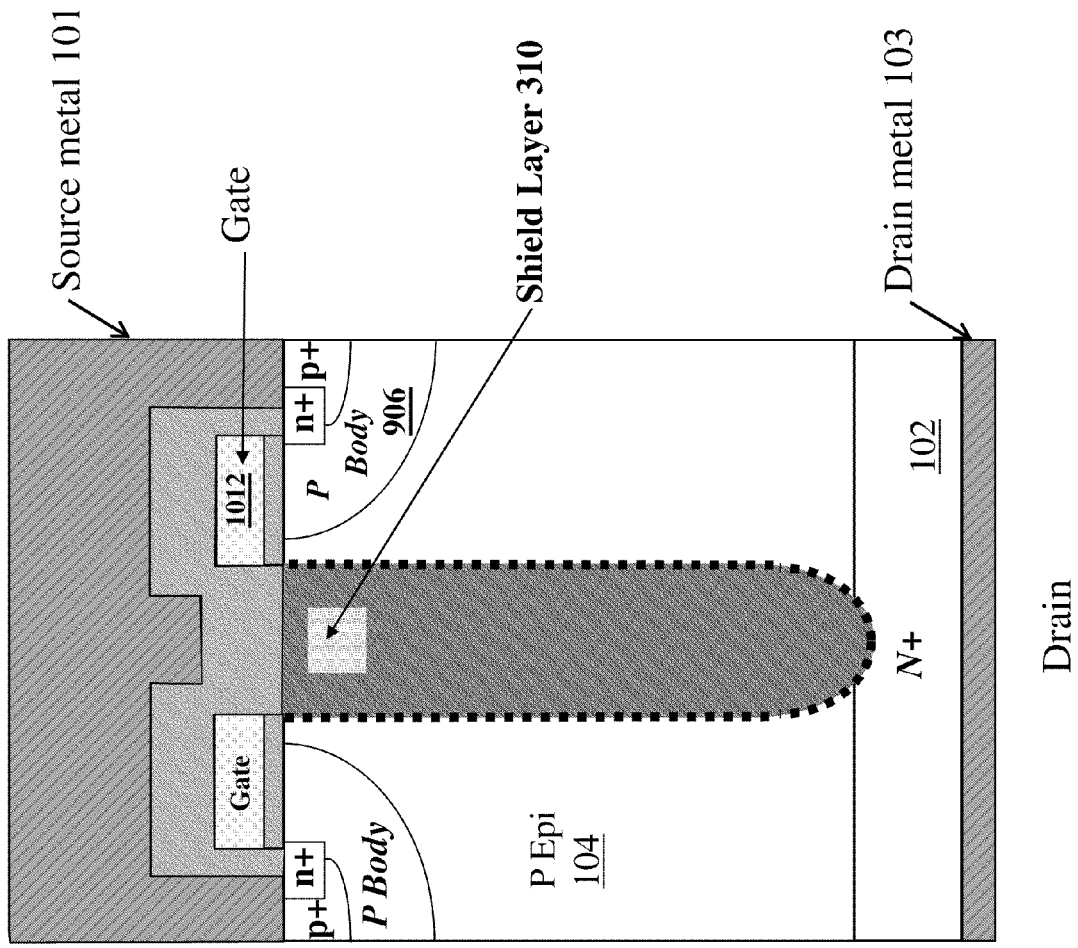
FIG. 11(a) is a cross-sectional structural diagram depicting a power device in accordance with yet another illustrative class of embodiments.

In FIG. 11(a), the device structure includes a gate electrode 1012 like that of FIG. 10a, together with a shield layer 310 as above, within the trench. This embodiment too reduces gate-drain coupling, with many resulting advantages.

Figure 11B:
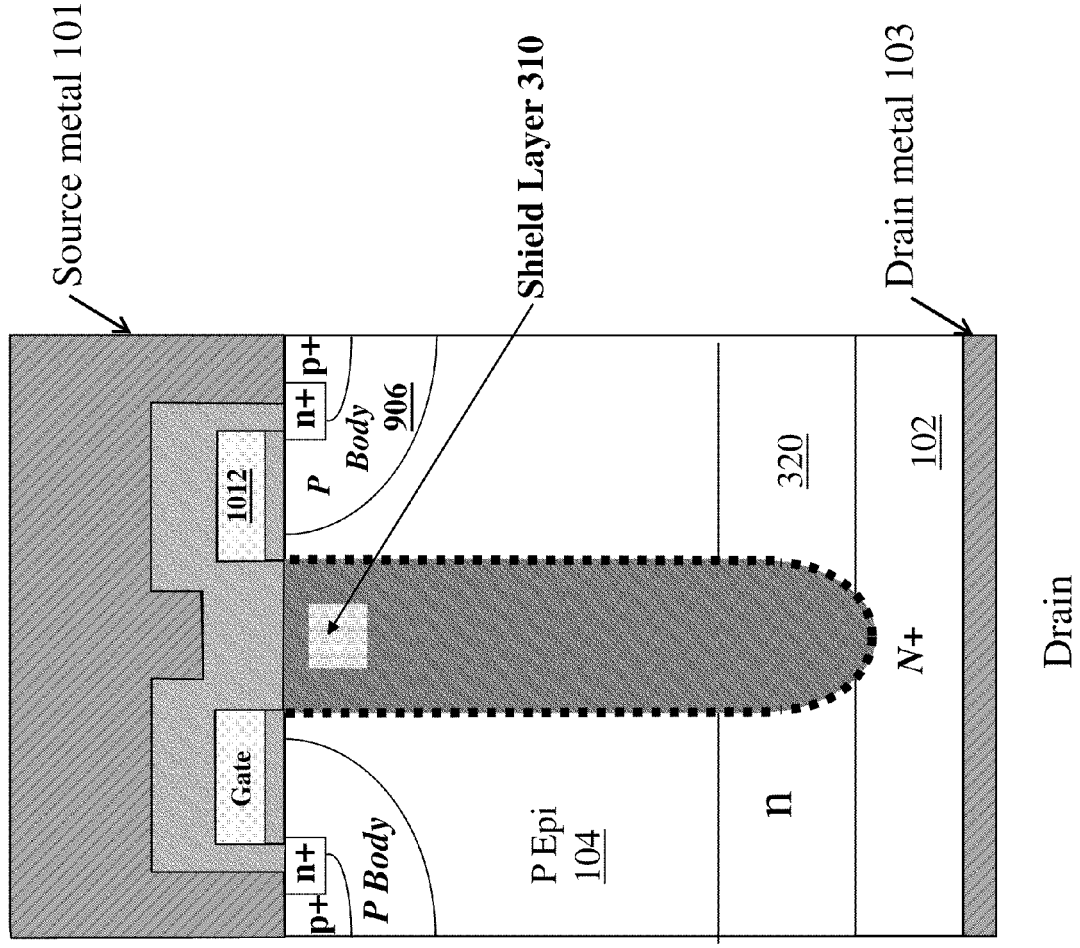
FIG. 11(b) is a cross-sectional structural diagram depicting a power device in accordance with yet another illustrative class of embodiments.

FIG. 11(b) shows a modified device structure which includes a thin drain region 320. This embodiment too reduces gate-drain coupling, with many resulting advantages.

Figure 11C:
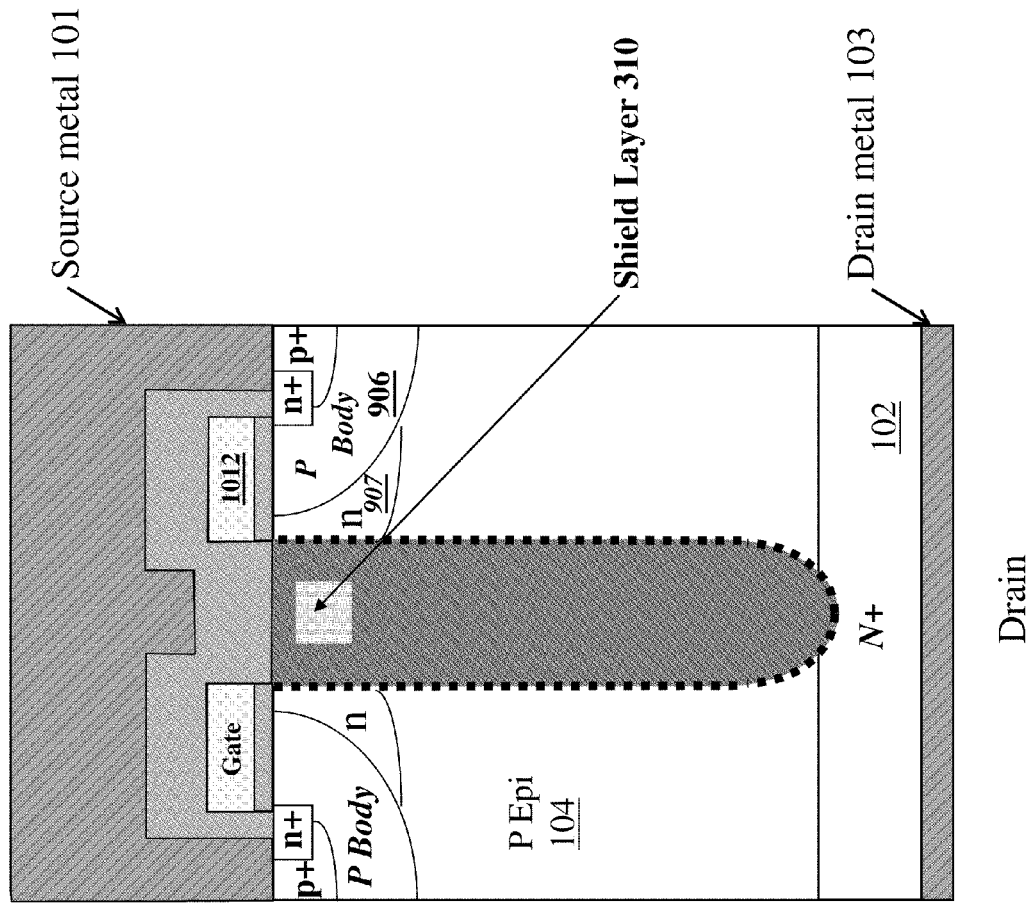
FIG. 11(c) is a cross-sectional structural diagram depicting a power device in accordance with yet another illustrative class of embodiments.

FIG. 11(c) shows a modified device structure which includes an n-type surface region 907. This embodiment too reduces gate-drain coupling, with many resulting advantages.

Figure 11D:
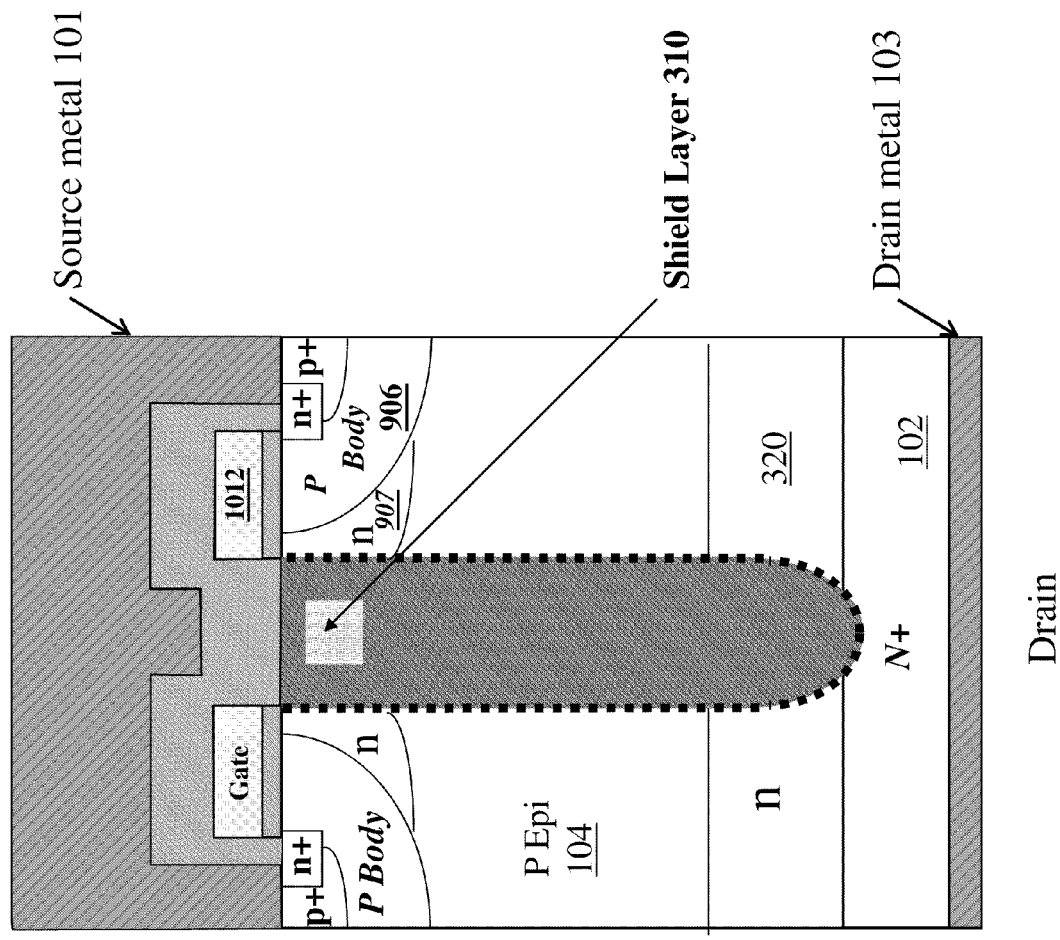
FIG. 11(d) is a cross-sectional structural diagram depicting a power device in accordance with yet another illustrative class of embodiments.

FIG. 11(d) shows a modified device structure which includes both an n-type surface region 907 and a thin drain region 320. This embodiment too reduces gate-drain coupling, with many resulting advantages.

Figure 12A:
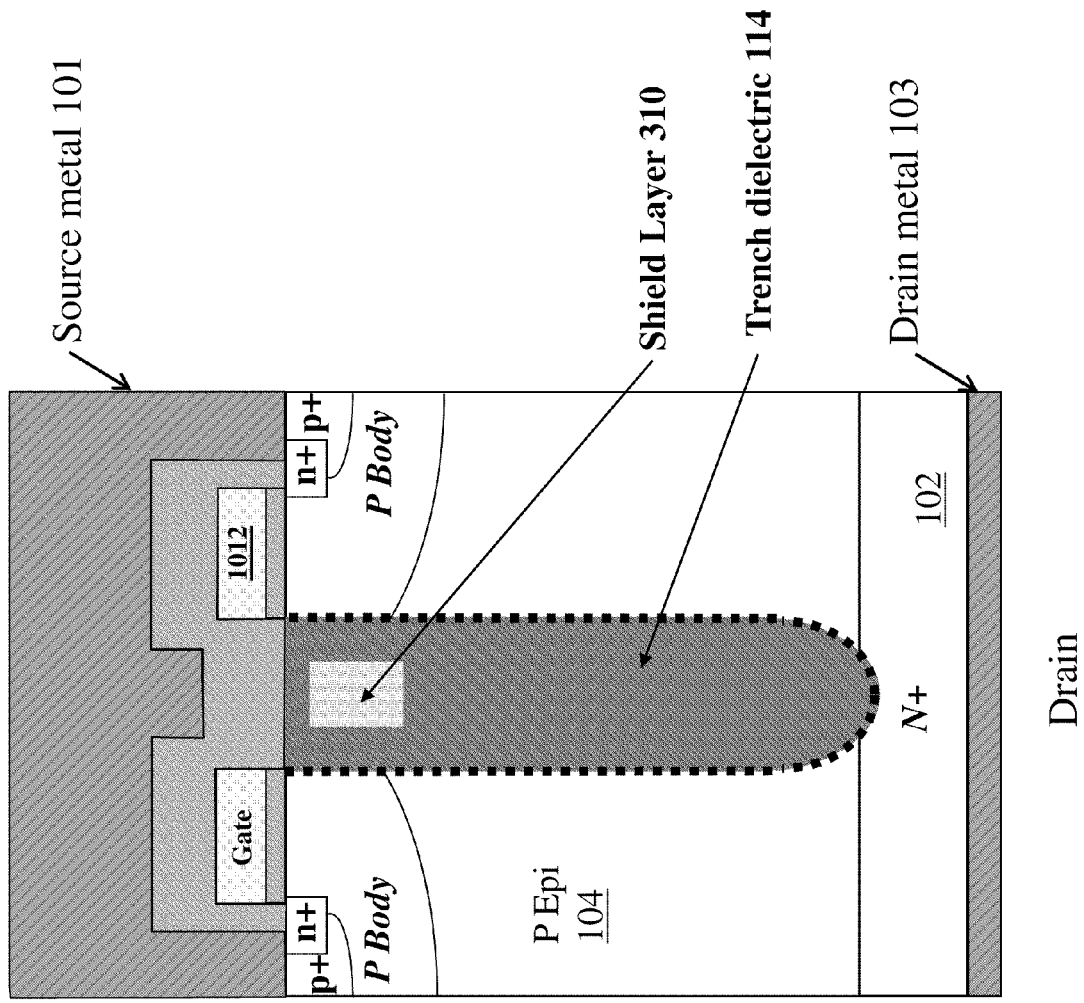
FIG. 12(a) is a cross-sectional structural diagram depicting a power device in accordance with yet another illustrative class of embodiments.

In FIG. 12(a), the p-body region 106 extends to the vertical portion of the trench dielectric 114. A shield layer 310 is positioned between the p-body regions, within the trench dielectric 114. Note that the geometry of the shield layer 310 is slightly different from that of FIG. 11(d), in that the shield layer of FIG. 12(a) has a greater vertical extent. (Specifically, in the example of FIG. 12(a), the shield layer 310 extends vertically to a depth which is deeper than the deepest point where p-type body diffusion 106 reaches the sidewall of the trench.) Note also that in this example the body diffusion 106 has the curved profile characteristic of a DMOS-type diffusion, which can (for example) correspond to an implant which is aligned to the source diffusion, but with deeper stopping distance and longer diffusion length. This embodiment too reduces gate-drain coupling, with many resulting advantages.

Figure 12B:
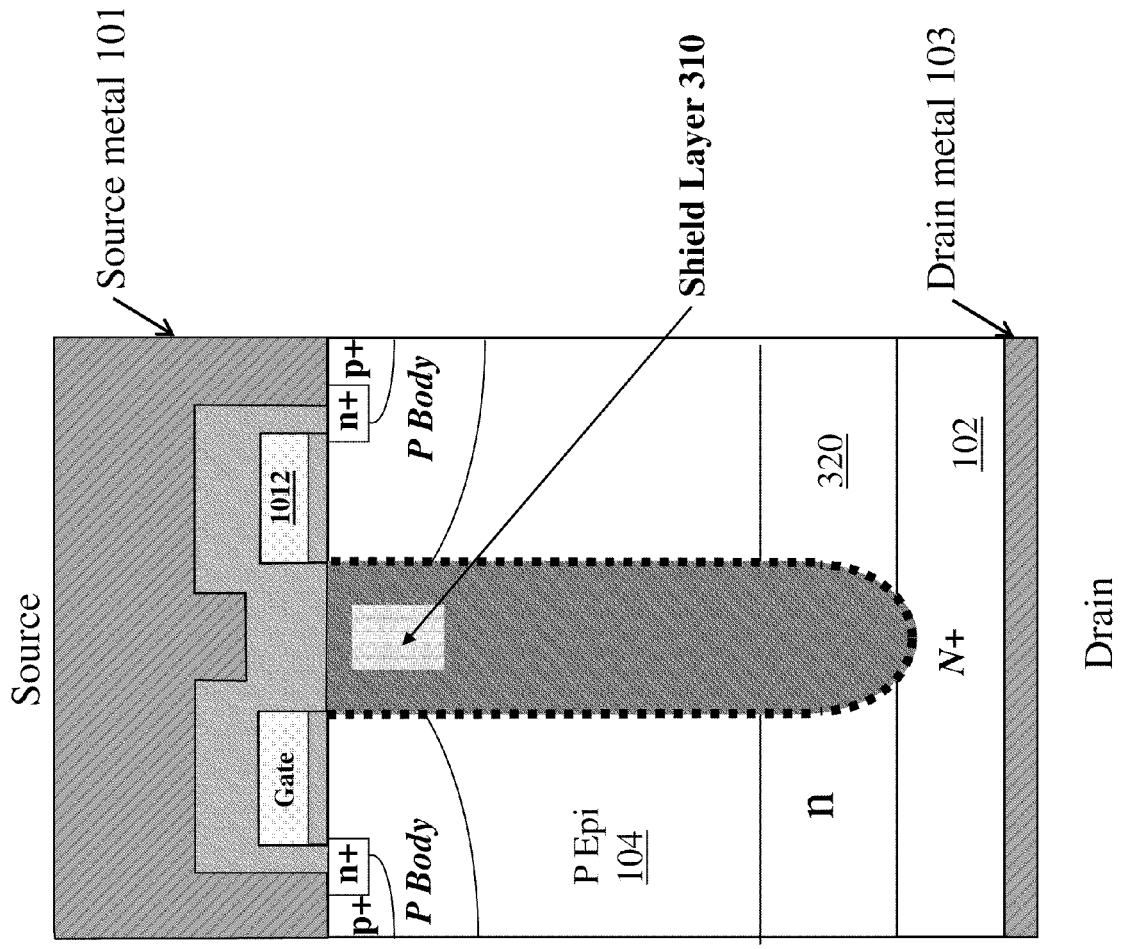
FIG. 12(b) is a cross-sectional structural diagram depicting a power device in accordance with yet another illustrative class of embodiments.

FIG. 12(b) shows a modified device structure which is generally similar to that of FIG. 10(a), but which also includes a thin drain region 320. This embodiment too reduces gate-drain coupling, with many resulting advantages.

Figure 13:
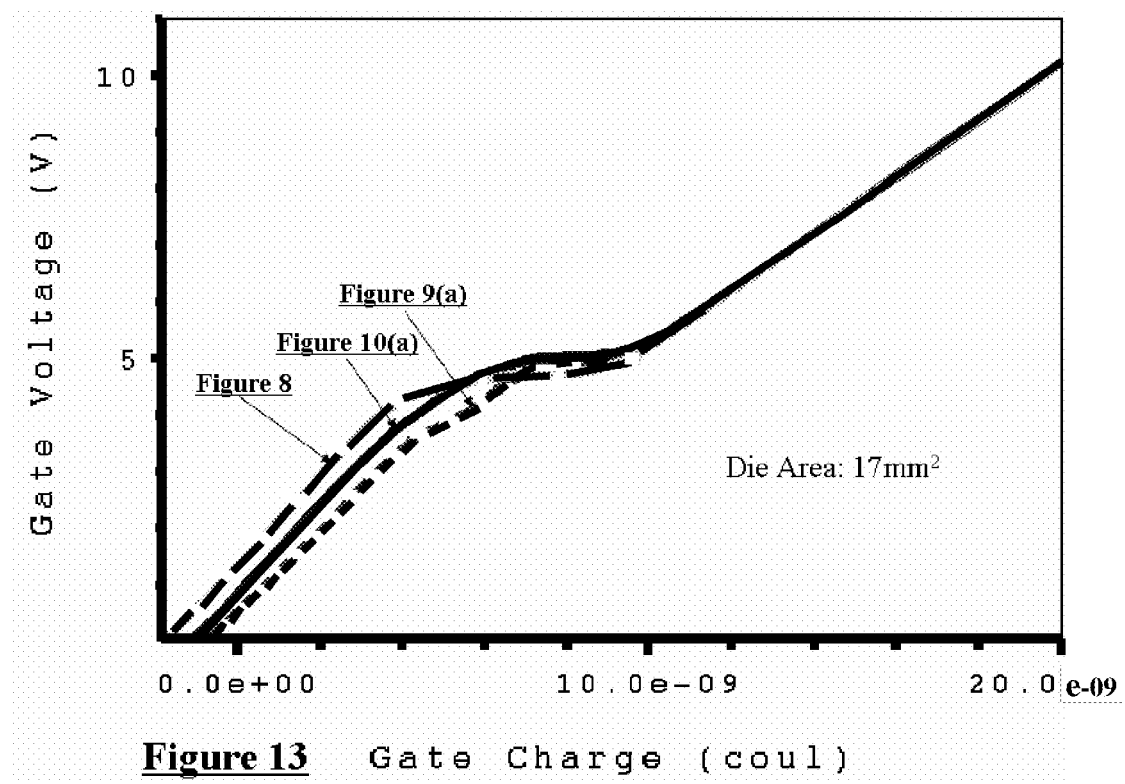
FIG. 13 is a graph plotting gate voltage against gate charge.

$Q_{gd}$ reduction in planar channel devices by using the new device structures is confirmed by the two dimensional simulation data as shown in FIG. 13. The drain-to-gate charge, $Q_{gd}$ ("Miller charge"), is the length of the plateau in the $V_{GS}$ vs. $Q_g$ curve shown in FIG. 13. Therefore, the new structures of FIG. 9(a) and FIG. 10(a) have less drain-to-gate charge $Q_{gd}$ and less drain-to-gate capacitance $C_{gd}$ than the structure of FIG. 8. The device in FIG. 9 shows the lowest $Q_{gd}$ and $C_{gd}$.

In addition, device edge or junction termination is needed. By making use of the field shaping effect of the fixed or permanent charge $Q_F$, simple and area efficient edge termination structures are also achieved.

Figure 14:
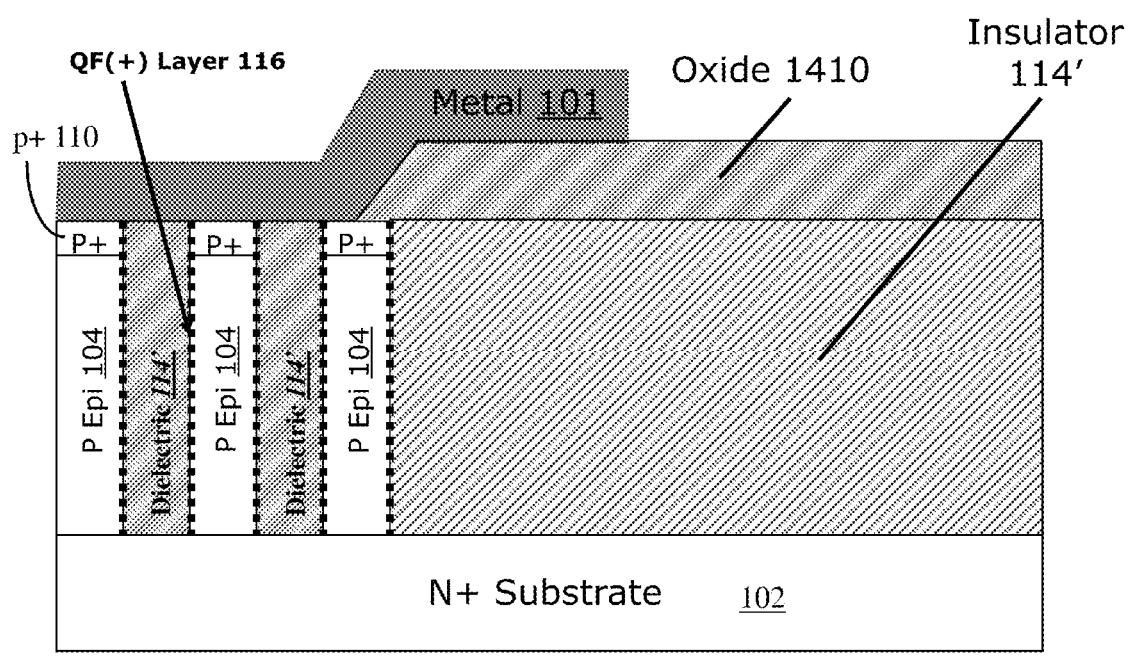
FIG. 14 is a cross-sectional structural diagram depicting a edge termination structure, in accordance with an illustrative class of embodiments.

One such new termination structure is illustrated in FIG. 14. The device structure of FIG. 3(a), and many others, can use this termination structure. In this termination structure, the epitaxial material 104 is patterned differently in the periphery, so that pillars or walls or vertical fins of epitaxial material are separated from each other by dielectric 114' (which is preferably the same as the trench fill dielectric 114, or can optionally be different). The separations between the portions of epitaxial material are preferably formed in the same step as the trench etch in the device array, and the sidewall fixed charge 116 is also preferably formed simultaneously with fabrication of the array. An outer dielectric 114'' (which can be the same as or different from the trench fill dielectric 114) surrounds this area, and is preferably overlain by an oxide mesa 1410, which provides a gradual transition for the potential coupled from the metal layer 101 to avoid high electric fields.

Ohmic contact to the p-type epitaxial material in the periphery can be provided, for example, by the p+ body contact diffusion 110 (as in this example), or alternatively by other p+ dopings in addition to or instead of this.

The off-state blocking characteristics of the new edge termination structures were simulated for different permanent (immobile) charge densities. The results are shown in FIGS. 15(a)/15(b) and 17(a)/17(b). The potential contours at the onset of the edge structures breakdown evidently prove that the new edge structure can terminate a device junction in a very efficient manner, and the termination breakdown capability can be controlled by properly adjusting the permanent charge density $Q_F$.

Figure 15:
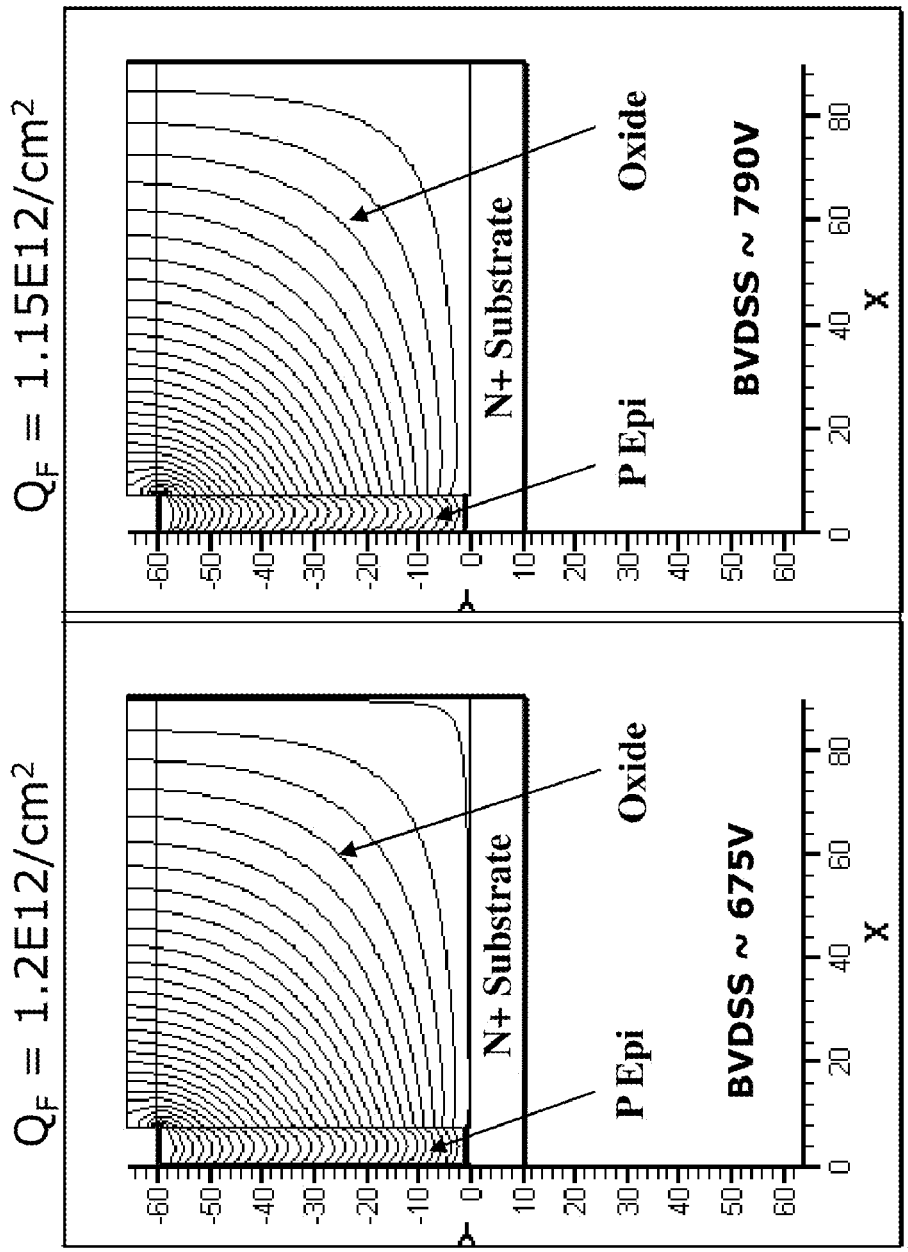
FIGS. 15(a)-15(b) show blocking characteristics, for the termination structure of FIG. 14, at the onset of breakdown, for two different fixed charge densities.

FIGS. 15(a) and 15(b) show two examples of fixed charge density, to help illustrate how variation in this parameter affects the breakdown voltage in the structure of FIG. 14. As seen in FIG. 15(*a*) (on the left side of this pair of drawings), a fixed charge density of $1.2 \times 10^{12}/cm^2$ in the structure of FIG. 14 yields a breakdown voltage (in this example) of 675V, by contrast, as seen in FIG. 15(*b*) (on the right side of this pair of drawings), a fixed charge density of $1.15 \times 10^{12}/cm^2$ in the structure of FIG. 14 yields a breakdown voltage (in this example) of 790V.

Figure 16:
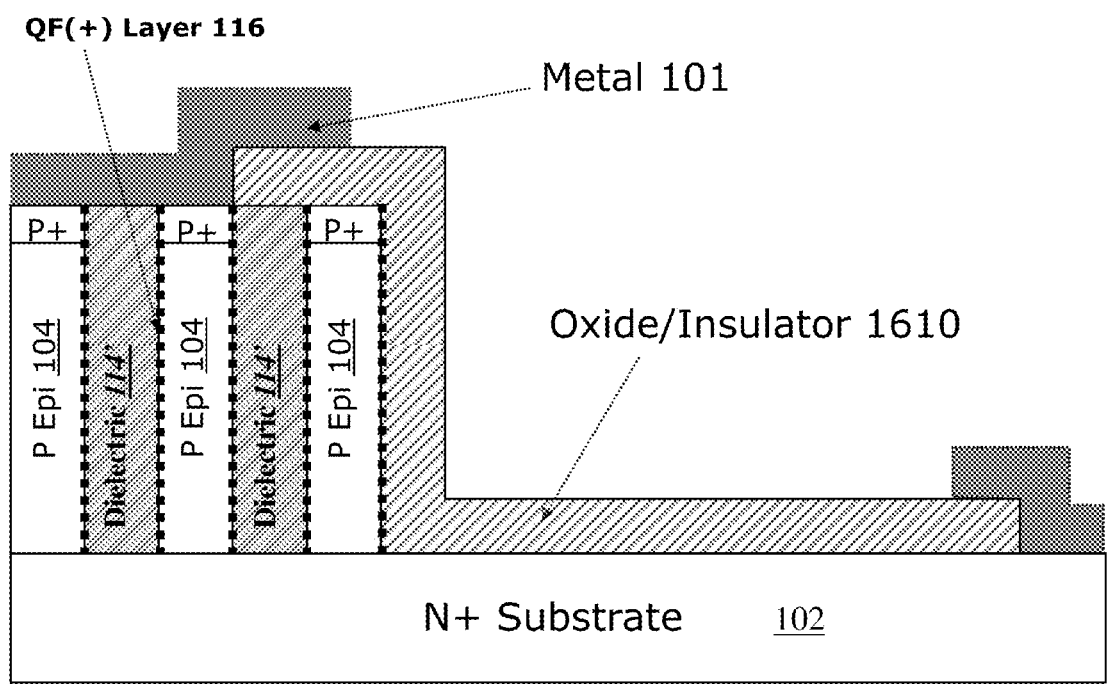
FIG. 16 is a cross-sectional structural diagram depicting a edge termination structure, in accordance with another illustrative class of embodiments.

FIG. 16 shows another edge termination structure, which, like FIG. 14, provides synergistic advantages in combination with the device structures described above. This structure is generally similar to FIG. 14, but uses a deep recess etch to remove the epitaxial layer 104 outside the rings of semiconductor 104 and dielectric 114'. Instead, an insulator layer 1610 covers the step where the epitaxial layer 104 ends.

FIGS. 17(*a*) and 17(*b*) are another pair of drawings, which show two examples of fixed charge density, to help illustrate how variation in this parameter affects the breakdown voltage in the structure of FIG. 16. A fixed charge density of $1.2 \times 10^{12}/cm^2$ (as seen on the left side) yields a breakdown voltage of 938V, and a fixed charge density of $1.15 \times 10^{12}/cm^2$ (as seen on the right side) yields a breakdown voltage of 739V. These examples are merely illustrative, but are provided to show that good breakdown voltages are achieved, and are affected by the choice of fixed charge density.

According to various embodiments, there is provided: A semiconductor device, comprising: a gate electrode, and a semiconductor body region positioned in proximity to said gate electrode so that voltage bias applied to gate electrode controls the existence of a channel in at least some parts of said body region, to thereby permit conduction through the device; a trench penetrating a semiconductor volume, and containing insulating material; permanent electrostatic charges in proximity to sidewalls of said trench; said semiconductor volume being electrically interposed between said channel and a drain region; and a conductive shield layer which is not electrically connected to said gate electrode, and which is positioned to be capacitively coupled both to said gate electrode and also to portions of said semiconductor volume which are in proximity to said permanent charges.

According to various embodiments, there is provided: a vertical power device comprising: a trench containing insulating material; a gate electrode; a semiconductor body region positioned so that a voltage bias on the gate electrode can cause an inversion layer in said body region, to thereby permit conduction through the device; permanent charges in proximity to sidewalls of said trench; and a conductive shield layer positioned below the level of said gate electrode and within said insulating material.

According to various embodiments, there is provided: A vertical semiconductor device comprising: a trench containing insulating material; one or more gate electrodes within said trench, wherein at least part of said insulating material lies between two portions of said gate electrodes within said trench; a semiconductor body region positioned so that a voltage bias on said gate electrodes can cause an inversion layer in said body region; and permanent charges included in said insulating material.

According to various embodiments, there is provided: A vertical semiconductor device comprising: an insulated trench containing insulating material; one or more gate electrodes within said trench; a semiconductor body region positioned so that a voltage bias on said gate electrodes can cause an inversion layer in said body region; permanent charges included in said insulating material; a conductive shield layer positioned below said gate electrode in said insulating material; and a shield via of conductive material, which passes vertically through an insulated opening which lies within the circumference of said gate electrodes within said trench.

According to various embodiments, there is provided: A planar semiconductor device comprising: a gate electrode positioned above a semiconductor body region which is doped to have mobile charge of a first polarity, such that a voltage bias on said gate electrode can cause an inversion layer in said body region; an insulated trench, which is at least partly surrounded by a semiconductor drift region having the same conductivity type as said body, and which includes permanent charges having a first polarity in proximity to a sidewall of said trench, such that the permanent charge causes an inversion layer in said drift region; and a surface layer having a second conductivity type opposite to the first conductivity type and positioned between said body region and said insulated trench.

According to various embodiments, there is provided: A planar trench semiconductor device comprising: a trench which contains insulating material, which is at least partly surrounded by a semiconductor drift region having the same conductivity type as said a first-conductivity-type body, and which includes permanent charges having a first polarity in proximity to a sidewall of said trench, such that the permanent charge causes an inversion layer in said drift region; one or more gate electrodes, and a semiconductor body region positioned so that a voltage bias on said gate electrodes can cause an inversion layer in said body region; a surface layer having a second conductivity type opposite to the first conductivity type and positioned between said body region and said trench; and one or more conductive shield layers positioned within the circumference of between said gate electrodes and at least partly overlying said trench.

According to various embodiments, there is provided: A semiconductor device, comprising: a gate electrode; a semiconductor body region below and capacitively coupled to said gate electrode, to thereby form a channel in dependence on the voltage of said gate electrode; a trench penetrating a semiconductor volume, and containing insulating material; permanent electrostatic charges in proximity to sidewalls of said trench; said semiconductor volume being electrically interposed between said channel and a drain region; and a conductive shield layer which is substantially coplanar with said gate electrode, and not electrically connected to said gate electrode.

According to various embodiments, there is provided: An edge termination structure for a semiconductor device comprising: an alternating sequence of insulation filled trenches and semiconductor material; and permanent charges included in said insulation filled trenches; wherein said alternating sequence is built in a semiconductor layer which overlies a semiconductor substrate, and said substrate extends to an edge which is outside of said semiconductor layer.

According to various embodiments, there is provided: A method for operating a vertical semiconductor device, comprising: gating emission of first-type majority carriers from a source region using a control gate; routing said majority carriers through an induced drain extension in a second-type semiconductor volume; said induced drain extension comprising an excess of said first-type carriers along the face of a dielectric trench in contact with said semiconductor volume, said excess being electrostatically induced by permanent charges; and reducing capacitance between said control gate and said semiconductor volume by use of a conductive shield beneath said control gate.

According to various embodiments, there is provided: Vertical power devices which include an insulated trench containing insulating material and a gate electrode, and related methods. A body region is positioned so that a voltage bias on the gate electrode will cause an inversion layer in the body region. A layer of permanent charge, at or near the sidewall of the trench, provides charge balancing for the space charge in the depleted semiconductor material during the OFF state. A conductive shield layer is positioned below the gate electrode in the insulating material, and reduces capacitive coupling between the gate and the lower part of the trench. This reduces switching losses. In other embodiments, a planar gate electrode controls horizontal carrier injection into the vertical conduction pathway along the trench, while a shield plate lies over the trench itself to reduce capacitive coupling.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The doping levels needed to achieve high breakdown and low-resistance are governed by the well known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in anyway. It is understood by those of ordinary skill in the art that the actual cell layout will vary depending on the specifics of the implementation and any depictions illustrated herein should not be considered a limitation in any way.

While only n-channel MOSFETs are shown here, p-channel MOSFETs are realizable simply by changing the polarity of the permanent charge and swapping n-type and p-type regions in any of the figures. This is well known by those of ordinary skill in the art.

It should be noted in the above drawings the positive and permanent charge was drawn for illustration purpose only. It is understood that the charge can be in the dielectric (oxide), at the interface between the silicon and oxide, inside the silicon layer or a combination of all these cases.

It is also understood that numerous combinations of the above embodiments can be realized.

It is understood by those of ordinary skill in the art that other variations to the above embodiments can be realized using other known termination techniques.

It is also understood that these inventions can also use the opposite polarity of permanent charge, with corresponding changes in the conductivity type of adjacent semiconductor material.

Other semiconductor materials, such as $Si_{0.9}Ge_{0.1}$, can optionally be used instead.

For another example, other modifications to source geometry can optionally be used, including additional gradation of dopant density and/or additional implants.

For another example, other modifications to drain geometry can optionally be used, including, for example, field plates, diffusions, additional gradation of dopant density, additional implants, and/or permanent charges to adjust surface conduction.

The following U.S. applications may contain additional information and alternative modifications, and all are hereby incorporated by reference: Ser. No. 11/971,096 (US 2008-0191307); Ser. No. 11/971,123 (US 2008-0164516); Ser. No. 11/971,139 (US2008-0164518); Ser. No. 11/971,152 (US2008-0164520); Ser. No. 11/971,169 (US2008-0166845); Ser. No. 12/367,716 (US2009-0206913); Ser. No. 12/368,399 (US2009-0206924); Ser. Nos. 12/369,385; 12/391,450; 12/392,131; 12/394,107; 12/418,808; 12/431,005; 12/431,852; 12/432,917; and 12/545,808. These generally have common assignee and overlapping inventorship with the present application, as well as direct or indirect copendency, and none are admitted to be prior art. All of these are hereby incorporated by reference herein for all purposes. Applicants reserve the right to claim priority to any of these.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method for operating a vertical semiconductor device, comprising:
    gating emission of first-type majority carriers from a source region using a control gate;
    routing said majority carriers through an induced drain extension in a second-type semiconductor drift region;
    said induced drain extension comprising an excess of said first-type carriers along the face of a dielectric trench in contact with said semiconductor drift region, said excess being electrostatically induced by permanent charges; and
    reducing capacitance between said control gate and said semiconductor drift region by use of a conductive shield beneath said control gate.

2. A method for operating a vertical semiconductor device, comprising:
    gating emission of first-type majority carriers from a source region using a control gate;
    routing said majority carriers through an induced drain extension in a second-type semiconductor drift region;
    said induced drain extension comprising an excess of said first-type carriers along the face of a dielectric trench in contact with said semiconductor drift region, said excess being electrostatically induced by permanent charges; and
    reducing capacitance between said control gate and said semiconductor drift region by use of a conductive shield beneath said control gate;
    wherein said permanent charges are cesium ions.

3. The method of claim 1, wherein the maximum width of said shield is less than the maximum width of said gate.

4. The method of claim 1, wherein both said shield and said gate lie entirely within said trench, and said gate is wider than said shield.

5. The method of claim 1, wherein said shield, but not said gate, lies entirely within said trench.

6. The method of claim 1, wherein said majority carriers are electrons.

7. A method for operating a vertical semiconductor device, comprising:
- gating emission of first-type majority carriers from a source region using a control gate;
- routing said majority carriers through an induced drain extension in a second-type semiconductor drift region;
- said induced drain extension comprising an excess of said first-type carriers along the face of a dielectric trench in contact with said semiconductor drift region, said excess being electrostatically induced by permanent charges; and
- reducing capacitance between said control gate and said semiconductor drift region by use of a conductive shield beneath said control gate;
- wherein said majority carriers are electrons, and said second conductivity type is p-type.

* * * * *